United States Patent
Kim et al.

(10) Patent No.: US 9,466,721 B1
(45) Date of Patent: Oct. 11, 2016

(54) SEMICONDUCTOR DEVICE HAVING STRESSOR AND METHOD OF FABRICATING THE SAME

(71) Applicants: Jinbum Kim, Seoul (KR); Kwanheum Lee, Suwon-si (KR); Hyunjae Kang, Gunpo-si (KR); Bonyoung Koo, Suwon-si (KR); Seokhoon Kim, Suwon-si (KR); Kanghun Moon, Incheon (KR); Jaeyoung Park, Yongin-si (KR); Byeongchan Lee, Yongin-si (KR); Sunyoung Lee, Yongin-si (KR); Choeun Lee, Pocheon-si (KR); Hanki Lee, Hwaseong-si (KR); Sujin Jung, Hwaseong-si (KR); Yang Xu, Hwaseong-si (KR)

(72) Inventors: Jinbum Kim, Seoul (KR); Kwanheum Lee, Suwon-si (KR); Hyunjae Kang, Gunpo-si (KR); Bonyoung Koo, Suwon-si (KR); Seokhoon Kim, Suwon-si (KR); Kanghun Moon, Incheon (KR); Jaeyoung Park, Yongin-si (KR); Byeongchan Lee, Yongin-si (KR); Sunyoung Lee, Yongin-si (KR); Choeun Lee, Pocheon-si (KR); Hanki Lee, Hwaseong-si (KR); Sujin Jung, Hwaseong-si (KR); Yang Xu, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/978,155
(22) Filed: Dec. 22, 2015
(30) Foreign Application Priority Data

Mar. 24, 2015 (KR) ........................ 10-2015-0040828

(51) Int. Cl.
*H01L 27/088* (2006.01)
*H01L 29/78* (2006.01)
*H01L 29/417* (2006.01)
*H01L 29/06* (2006.01)
*H01L 29/423* (2006.01)
*H01L 29/10* (2006.01)

(52) U.S. Cl.
CPC ......... *H01L 29/785* (2013.01); *H01L 29/0649* (2013.01); *H01L 29/0657* (2013.01); *H01L 29/1054* (2013.01); *H01L 29/41791* (2013.01); *H01L 29/42364* (2013.01)

(58) Field of Classification Search
CPC ........... H01L 29/785; H01L 29/41791; H01L 29/0649; H01L 29/0657; H01L 29/1054; H01L 29/42364
See application file for complete search history.

(56) References Cited

U.S. PATENT DOCUMENTS

| | | | |
|---|---|---|---|
| 7,732,304 B2 | 6/2010 | Jeong | |
| 8,598,003 B2 | 12/2013 | Murthy et al. | |
| 8,906,759 B2 | 12/2014 | Basker et al. | |
| 2013/0040440 A1 | 2/2013 | Adam et al. | |
| 2014/0151806 A1 | 6/2014 | Basker et al. | |
| 2016/0064387 A1* | 3/2016 | Jeong | H01L 27/1104 257/401 |
| 2016/0087053 A1* | 3/2016 | Kim | H01L 29/41783 257/369 |
| 2016/0111540 A1* | 4/2016 | Zhang | H01L 29/7851 257/401 |

\* cited by examiner

*Primary Examiner* — Thanh Y Tran
(74) *Attorney, Agent, or Firm* — Harness, Dickey & Pierce

(57) ABSTRACT

A semiconductor device may include a fin active region including a lower fin active region surrounded by a device isolation layer and an upper fin active region protruding from a top surface of the device isolation layer, a gate pattern disposed on top and side surfaces of the upper fin active region, and a source/drain region formed in the fin active region located at a side of the gate pattern. The gate pattern extends onto the device isolation region. The source/drain region includes a trench and epitaxial layers that fill the trench. Sidewalls of the trench include first sidewalls and second sidewalls that connect the first sidewalls to a bottom surface of the trench. The bottom surface of the trench is located at a lower level than the top surface of the device isolation layer beneath the gate pattern, and the second sidewalls of the trench have inclined {111} planes.

20 Claims, 42 Drawing Sheets

SEMICONDUCTOR DEVICE HAVING STRESSOR AND METHOD OF FABRICATING THE SAME

CROSS-REFERENCE TO RELATED APPLICATION

The present application claims under 35 U.S.C. §119 priority to and the benefit of Korean Patent Application No. 10-2015-0040828 filed on Mar. 24, 2015, the entire disclosure of which is incorporated by reference herein.

BACKGROUND

1. Technical Field

Embodiments of the inventive concepts relate to a semiconductor device having a stressor and a method of fabricating the same.

2. Description of Related Art

Various methods have been studied to improve electrical characteristics of a semiconductor device using a stressor. The stressor can be formed by forming trench in a fin active region and growing an epitaxial layer in the trench. At this time, when the thickness of the epitaxial growth layer is greater than the critical thickness or residues remain on inner wall of the trench, stacking faults of the epitaxial layer can occur. When the stacking faults of the epitaxial layer occur, compressive strain applying to a channel region can be reduced. Accordingly, hole mobility in the channel region can be reduced.

SUMMARY

Embodiments of the inventive concepts provide a semiconductor device in which stacking faults of an epitaxial layer are reduced.

Other embodiments of the inventive concepts provide a method of fabricating the semiconductor device.

Other embodiments of the inventive concepts provide electronic devices including the semiconductor device.

The technical objectives of the inventive concepts are not limited to the above objective. Other objectives may become apparent to those of ordinary skill in the art based upon the following descriptions.

In accordance with an aspect of the inventive concepts, a semiconductor device includes a fin active region including a lower fin active region surrounded by a device isolation layer and an upper fin active region protruding from a top surface of the device isolation layer, a gate pattern on top and side surfaces of the upper fin active region, and a source/drain region which is formed in the fin active region of a side of the gate pattern. The gate pattern extends onto the device isolation region. The source/drain region includes a trench and epitaxial layers filling the trench. The trench includes a bottom surface and sidewalls. The sidewalls of the trench include first sidewalls and second sidewalls, the second sidewalls connecting the first sidewalls to the bottom surface. The bottom surface of the trench is located at a lower level than the top surface of the device isolation layer under the gate pattern, and the second sidewalls of the trench have inclined {111} planes.

In accordance with another aspect of the inventive concepts, a semiconductor device includes a fin active region protruding from a substrate, a device isolation layer surrounding a lower portion of the fin active region and having a first portion and a second portion, a gate pattern covering an upper portion of the fin active region and extending onto the first portion of the device isolation layer, and an epitaxial region formed in the fin active region located at a side of the gate pattern. A bottom surface of the epitaxial region is located at a lower level than a top surface of the first portion of the isolation layer. The bottom surface of the epitaxial region is coplanar with a top surface of the second portion of the device isolation layer. Side surfaces of the epitaxial region may include first side surfaces and second side surfaces connecting the first side surfaces to the bottom surface. The second side surfaces of the epitaxial region may have inclined {111} planes.

In accordance with still another aspect of the inventive concepts, a semiconductor device includes a substrate, fin active regions protruding from the substrate and extending parallel to each other in a first direction, a device isolation layer formed between the fin active regions to cover lower portions of the fin active regions, gate patterns covering upper portions of the fin active regions and extending parallel to each other in a second direction perpendicular to the first direction, spacers on side surfaces of the gate patterns, and stressors formed on the lower portions of the fin active regions between the gate patterns. The stressors include first side surfaces located at the upper portions of the fin active regions and second side surfaces located at the lower portions of the fin active region. Distances of the second side surfaces are smaller than distances of the first side surfaces. The second side surfaces of the stressors have inclined {111} planes. The first and second side surfaces vertically overlap the spacers.

Details of other embodiments are included in the detailed description and drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
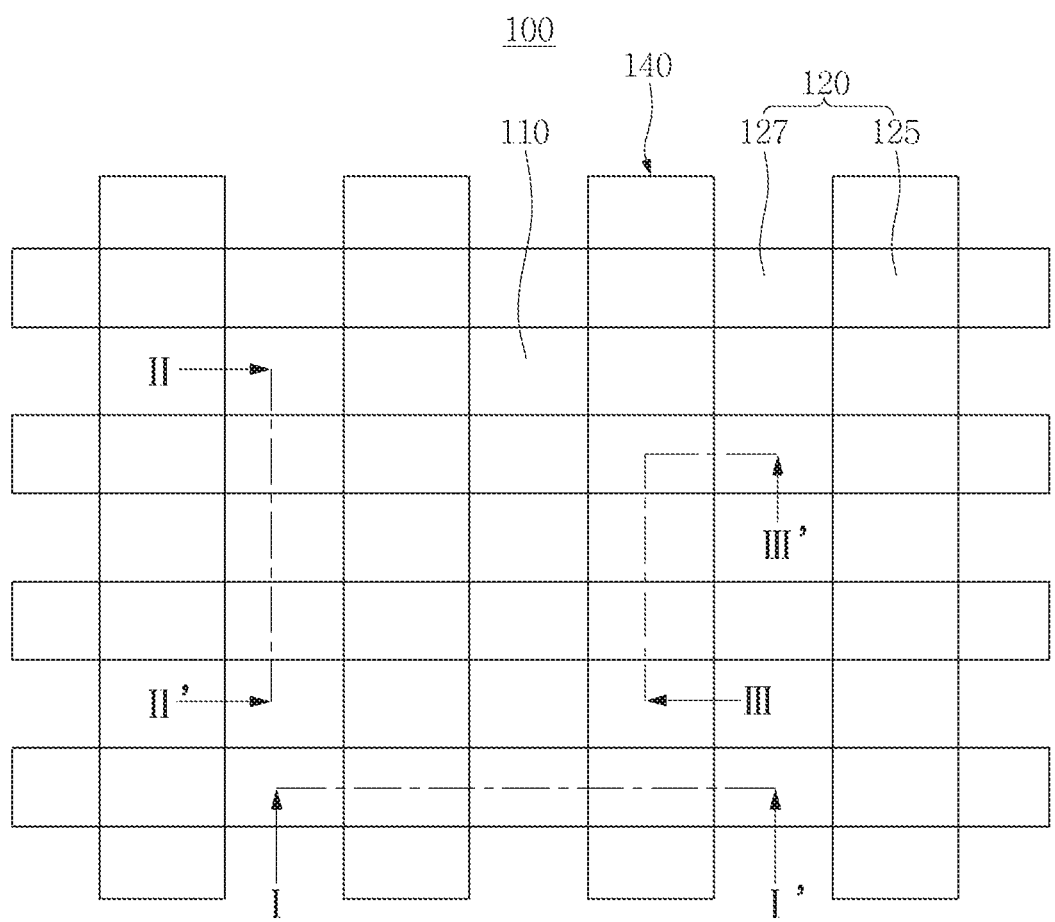
FIG. 1 is a layout showing a semiconductor device according to an embodiment of the inventive concepts.

Various example embodiments will now be described more fully with reference to the accompanying drawings. The inventive concepts disclosed herein may, however, be embodied in different forms and should not be construed as limited to the example embodiments set forth herein. Rather, these embodiments are provided so that this disclosure is thorough and complete and fully conveys the inventive concepts to those skilled in the art.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIG. 1 is a layout illustrating a semiconductor device 100 according to an embodiment of the inventive concepts.

Referring to FIG. 1, a semiconductor device 100 according to the embodiment of the inventive concepts may include fin active regions 120 disposed on a substrate 110 and having line or bar shapes in parallel, and gate patterns 140 configured to vertically intersect the fin active regions 120 and having line or bar shapes in parallel. The fin active regions 120 may include channel areas 125 and source/drain areas 127. The channel areas 125 may overlap the gate pattern 140. The source/drain areas 127 may not overlap the gate pattern 140. For example, the source/drain areas 127 may be formed between the adjacent gate patterns 140.

Figure 2A:
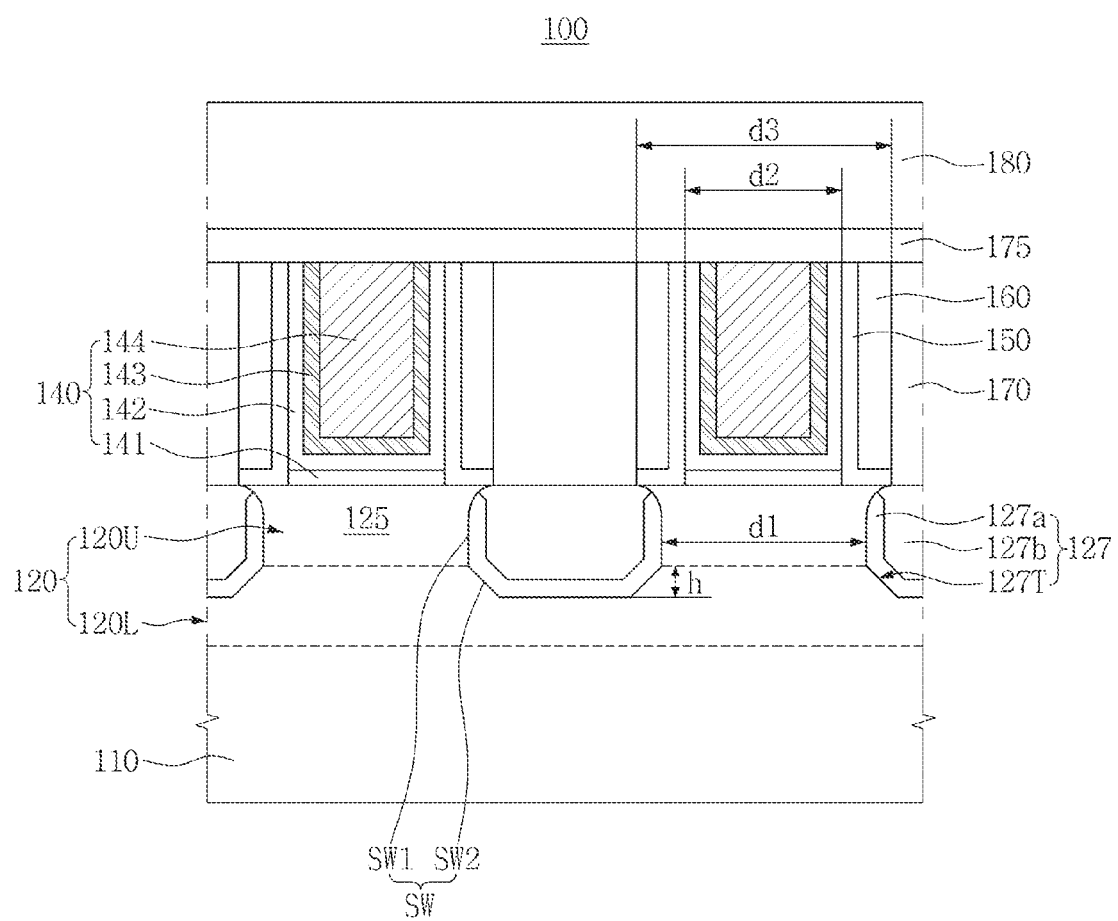
FIGS. 2A to 2C are cross-sectional views taken along lines I-I', II-II' and III-III' of FIG. 1 for describing a semiconductor device according to an embodiment of the inventive concepts.
Figure 2B:
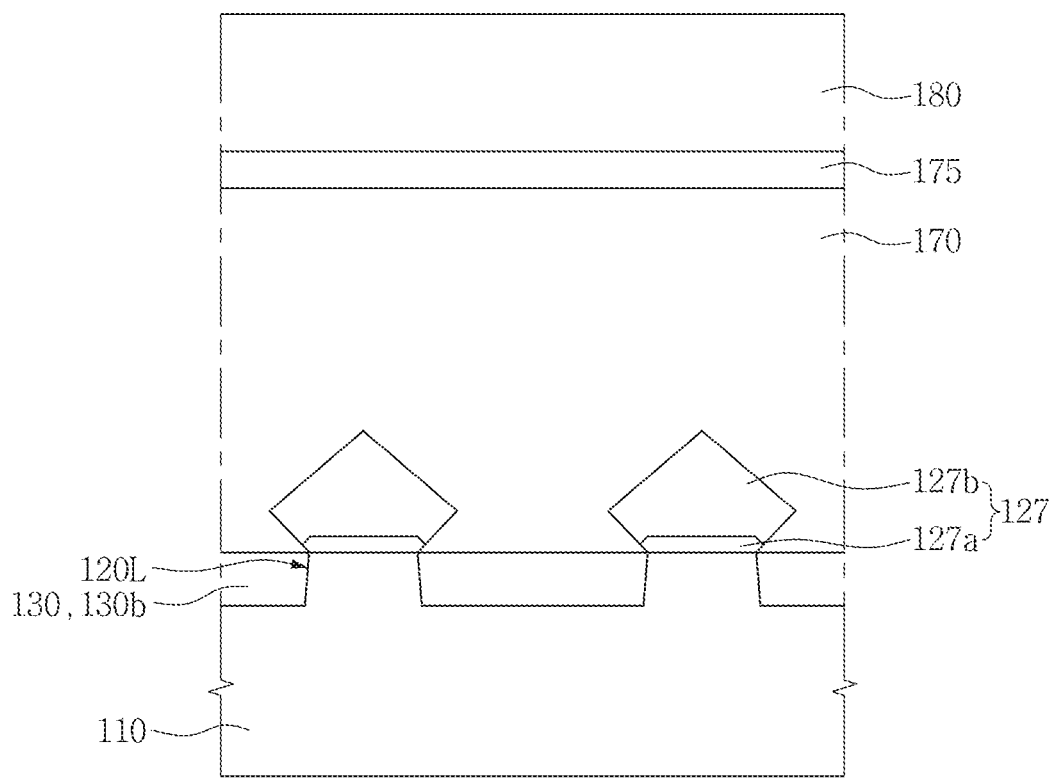
Figure 2C:
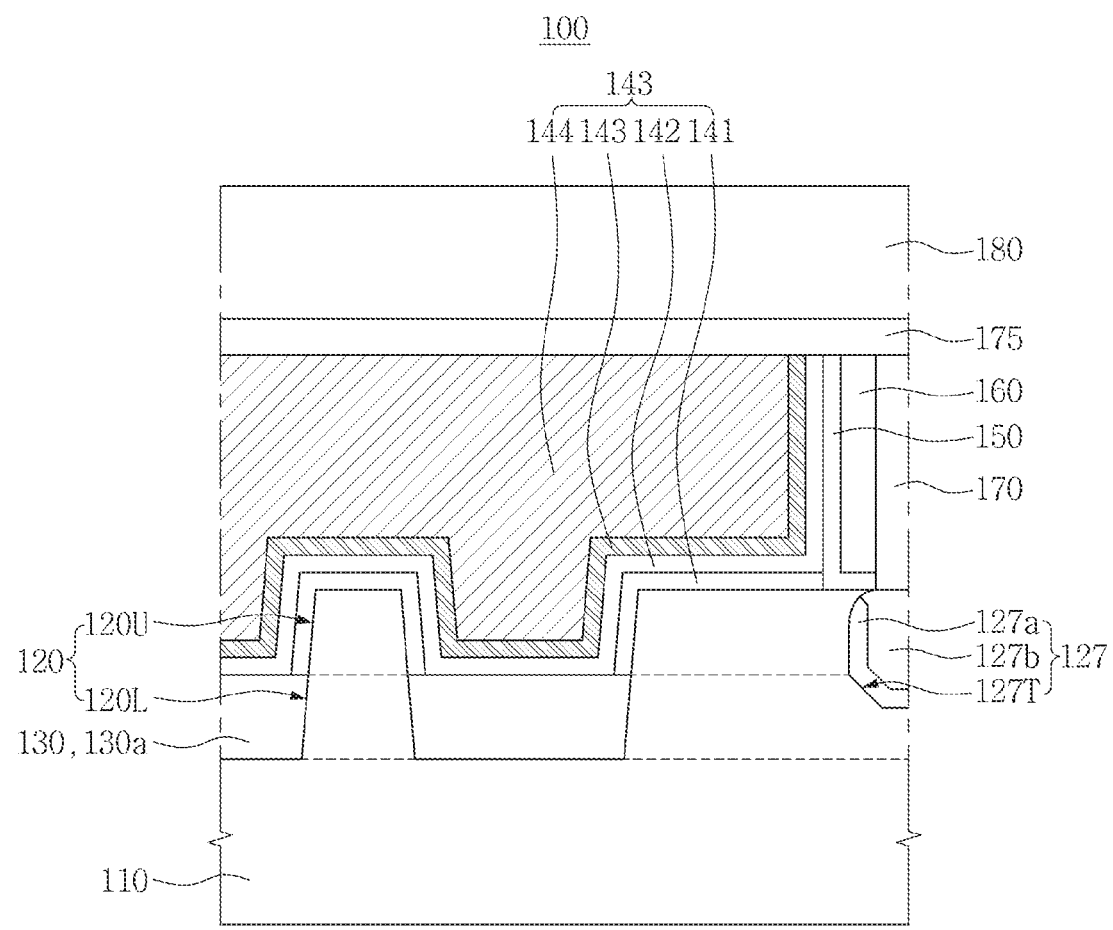

FIG. 2A shows a cross-sectional view taken along line I-I' of FIG. 1, FIG. 2B shows a cross-sectional view taken along line II-II' of FIG. 1, and FIG. 2C shows a cross-sectional view taken along line III-III' of FIG. 1.

Referring to FIGS. 1 and 2A to 2C, a semiconductor device 100 in accordance with an embodiment of the inventive concepts may include fin active regions 120 on a substrate 110, a device isolation layer 130, gate patterns 140, inner spacers 150, outer spacers 160, a lower interlayer insulating layer 170, and an upper interlayer insulating layer 180.

The substrate 110 may include a single crystalline semiconductor substrate such as a silicon wafer or a silicon-on-insulator (SOI) wafer.

The fin active regions 120 may protrude from the substrate 110. The fin active regions 120 may be parts of the substrate 110. For example, the fin active regions 120 may be materially in continuity with the substrate 110. The fin active regions 120 may include lower fin active regions 120L and upper fin active regions 120U. A boundary between the substrate 110 and the lower fin active regions 120L and a boundary between the lower fin active regions 120L and the upper fin active regions 120U are indicated by dotted lines, but the substrate 110 and the lower fin active regions 120L, and the lower fin active regions 120L and the upper fin active regions 120U may be materially continuity with each other. Side surfaces of the lower fin active regions 120L may be surrounded by the device isolation layer 130. Top and side surfaces of the upper fin active regions 120U may be partially surrounded by the gate patterns 140. The fin active regions 120 may include channel areas 125 and source/drain areas 127.

The channel areas 125 may be formed in the upper fin active regions 120U that are surrounded by the gate patterns 140.

The source/drain areas 127 may be formed on the lower fin active regions 120L that are not covered by the gate patterns 140. The source/drain areas 127 may be formed between the channel areas 125. For example, the source/drain areas 127 may not be materially continuity with the substrate 110, the lower fin active regions 120L and the channel areas 125.

Distances d1 between the source/drain areas 127 may be greater than widths d2 of the gate patterns 140. The distances d1 between the source/drain areas 127 may be smaller than distances d3 between outer side surfaces of the outer spacers 160 on both sides of the gate patterns 140. The source/drain areas 127 may include source/drain trenches 127T, first epitaxial layers 127a, and second epitaxial layers 127b.

The source/drain trenches 127T may be formed between the channel areas 125 from surfaces of the fin active regions 120 toward an inside of the substrate 110. Referring to FIGS.

2A and 2C, bottom surfaces of the source/drain trenches 127T may be located at a lower level than hypothetical boundaries (dotted line) between the lower fin active regions 120L and the upper fin active regions 120U. In other words, the bottom surfaces of the source/drain trenches 127T may be located at a lower level than a top surface of the device isolation layer 130 beneath the gate patterns 140.

Sidewalls SW of the source/drain trenches 127T may include first sidewalls SW1 that are located in the upper fin active regions 120U and second sidewalls SW2 that are located in upper portions of the lower fin active regions 120L. Lengths of the second sidewalls SW2 may be smaller than lengths of the first sidewalls SW1. The second sidewalls SW2 of the source/drain trenches 127T may have inclined {111} planes. The second sidewalls SW2 of the source/drain trenches 127T may not horizontally overlap the channel areas 125. The sidewalls SW of the source/drain trenches 127T may vertically overlap the inner spacers 150 and/or the outer spacers 160. The sidewalls SW of the source/drain trenches 127T may be convex toward the channel areas 125. Upper ends of the first sidewalls SW1 of the source/drain trenches 127T may have round shapes. Heights h of the second sidewalls SW2 of the source/drain trenches 127T may be less than or equal to 20 nm from the bottom surface of the source/drain trenches 127T.

The first epitaxial layers 127a may be conformally formed on inner walls of the source/drain trenches 127T. The first epitaxial layers 127a may not be formed on the inner walls of upper ends of the source/drain trenches 127T. Referring to FIG. 2B, the first epitaxial layers 127a may have line-shaped longitudinal sections. The first epitaxial layers 127a may include an epitaxially grown single crystalline silicon germanium (SiGe).

The second epitaxial layers 127b may be formed on the first epitaxial layers 127a to fill the source/drain trenches 127T. Referring to FIG. 2B, the second epitaxial layers 127b may have diamond-shaped longitudinal sections. The second epitaxial layers 127b may include an epitaxially grown single crystalline silicon germanium (SiGe). The germanium content of the second epitaxial layers 127b may be greater than the germanium content of the first epitaxial layers 127a. For example, the first epitaxial layers 127a may include the single crystalline silicon germanium (SiGe) that has germanium at a content less than or equal to 30%. The second epitaxial layers 127b may include the single crystalline silicon germanium (SiGe) that has germanium at a content more than or equal to 30%. Since the first epitaxial layers 127a are not formed on the inner walls of the upper ends of the source/drain trenches 127T, the second epitaxial layers 127b may be in direct contact with the inner walls of the upper ends of the source/drain trenches 127T.

In the embodiment of the inventive concepts, as described above, since the source/drain areas 127 include the single crystalline silicon germanium (SiGe) that has a lattice constant greater than the substrate 110, the source/drain areas 127 may operate as stressors that apply compressive strain to the channel areas 125.

The device isolation layer 130 may be formed on the substrate 110 to surround side surfaces of the lower fin active regions 120L. The device isolation layer 130 may include first portions 130a beneath the gate patterns 140 and second portions 130b that not covered by the gate patterns 140. Top surfaces of the second portions 130b of the device isolation layer 130 may be located at a lower level than top surfaces of the first portions 130a of the device isolation layer 130. Also, top surfaces of the first portions 130a of the device isolation layer 130 may be located at a higher level than bottom surfaces of the source/drain areas 127, and top surfaces of the second portions 130b of the device isolation layer 130 may be substantially coplanar with the bottom surfaces of the source/drain areas 127. The device isolation layer 130 may include silicon oxide.

The gate patterns 140 may be formed on the channel areas 125. For example, the gate patterns 140 may surround top and side surfaces of the channel areas 125. The gate patterns 140 may include surface insulating patterns 141, gate insulating patterns 142, gate barrier patterns 143, and gate electrode patterns 144.

The surface insulating patterns 141 may be formed on the channel areas 125. The surface insulating patterns 141 may have horizontal bar-shaped longitudinal sections and line-shaped or square shaped cross sections. The surface insulating patterns 141 may include thermal silicon oxide. In the other embodiments, the surface insulating patterns 141 may be omitted.

The gate insulating patterns 142 may be formed on the surface insulating patterns 141. The gate insulating patterns 142 may have U-shaped longitudinal sections. For example, outer side surfaces of the gate insulating patterns 142 may be in contact with inner side surfaces of the inner spacers 150. The gate insulating patterns 142 may include a high-k dielectric insulator, such as hafnium oxide (HfO), aluminum oxide (AlO), zirconium oxide (ZrO), lanthanum oxide (LaO), or another metal oxide.

The gate barrier patterns 143 may be formed on the gate insulating pattern 142. The gate barrier patterns 143 may have U-shaped longitudinal sections. For example, outer side surfaces of the gate barrier patterns 143 may be in contact with inner side surfaces of the gate insulating patterns 142. The gate barrier patterns 143 may include a barrier metal, such as titanium (Ti), titanium nitride (TiN), tantalum (Ta), tantalum nitride (TaN), or titanium tungsten (TiW).

The gate electrode patterns 144 may be formed on the gate barrier patterns 143. Side and bottom surfaces of the gate electrode patterns 144 may be surrounded by the gate barrier patterns 143. The gate electrode patterns 144 may include a highly conductive metal, such as tungsten (W) or copper (Cu). Top surfaces of the gate insulating patterns 142, top surfaces of the gate barrier patterns 143, and top surfaces of the gate electrode patterns 144 may be coplanar.

The inner spacers 150 may be formed on side surfaces of the gate patterns 140. For example, the inner spacers 150 may be in contact with side surfaces of the surface insulating patterns 141, outer surfaces of the gate insulating patterns 142, and top surfaces of the fin active regions 120. The inner spacers 150 may include silicon oxide (SiO), silicon nitride (SiN), silicon oxynitride (SiON), or silicon oxycarbonitride (SiCON). For example, the inner spacers 150 may include SiN.

The outer spacers 160 may be formed on the outer side surfaces of the inner spacers 150. The outer spacers 160 may include silicon oxide (SiO), silicon nitride (SiN), silicon oxynitride (SiON), or silicon oxycarbonitride (SiCON). For example, the outer spacers 160 may include SiCON. The outer spacers 160 may include an insulating material that has a lower dielectric constant than the inner spacers 150.

The lower interlayer insulating layer 170 may cover the source/drain areas 127 and surround side surfaces of the gate patterns 140. A top surface of the lower interlayer insulating layer 170, top surfaces of the gate patterns 140, top surfaces of the inner spacers 150, and top surfaces of the outer spacers 160 may be coplanar. The lower interlayer insulating layer 170 may include silicon oxide.

The upper interlayer insulating layer 180 may cover the lower interlayer insulating layer 170, the gate patterns 140, the inner spacers 150, and the outer spacers 160. The upper interlayer insulating layer 180 may include silicon oxide.

The semiconductor device 100 may further include a stopper layer 175 formed between the lower interlayer insulating layer 170 and the upper interlayer insulating layer 180.

The stopper layer 175 may include silicon nitride.

The semiconductor device 100 according to the embodiment of the inventive concepts has been described above. The semiconductor device 100 according to the embodiment of the inventive concepts may include a source/drain trench 127T having a lower sidewall that has inclined {111} planes. Accordingly, a critical thickness of an epitaxial layer that is formed in the trench can be increased. As a result, since a thickness of an epitaxial growth layer does not exceed the critical thickness, a problem that stacking faults occur in the epitaxial growth layer can be overcome.

When the problem that the stacking faults occur in the epitaxial growth layer is overcome, a decrease of a compressive strain that is applied to a channel area 125 may be reduced or prevented. As a result, a performance of a semiconductor device can be improved by increasing hole mobility in the channel area 125.

Also, since the lower sidewall of the source/drain trench 127T having the inclined {111} planes may be located at a lower level than the channel area 125, a distance between side surfaces of source/drain areas 127 being in contact with both sides of the channel area 125 can be almost constant from an upper end of the channel area to a lower end of the channel area 125. As a result, compressive strain can be constantly applied to the entire channel area 125.

FIGS. 3A to 15A are cross-sectional views taken along line I-I' of FIG. 1, FIGS. 3B to 15B are cross-sectional views taken along line II-II' of FIG. 1, and FIGS. 6C to 15C are cross-sectional views taken along line III-III' of FIG. 1.

Figure 3A:
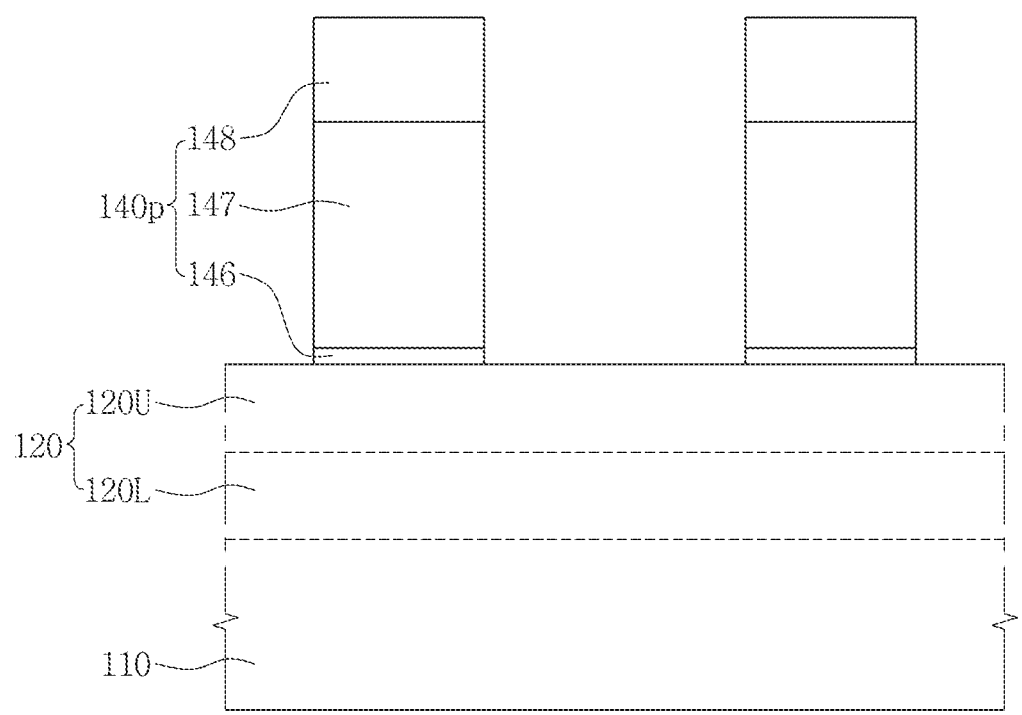
FIGS. 3A to 15C are views illustrating methods of fabricating a semiconductor device according to an embodiment of the inventive concepts.
Figure 3B:
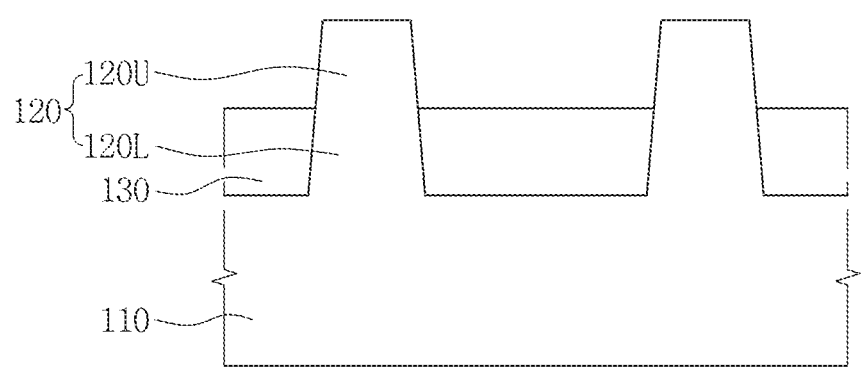

Referring to FIGS. 3A and 3B, the method of fabricating the semiconductor device 100 in accordance with the embodiment of the inventive concepts may include providing a substrate 110, and forming fin active regions 120, a device isolation layer 130, and preliminary gate patterns 140p.

The substrate 110 may include a single crystalline semiconductor substrate such as a silicon wafer or SOI wafer.

The forming of the fin active regions 120 on the substrate 110 may include forming a recess mask on the substrate 110, and forming the fin active regions 120 and trenches by selectively etching the substrate 110 using the recess mask as an etch mask. The fin active regions 120 may protrude from the substrate 110.

The forming of the device isolation layer 130 may include filling the trenches with a device isolation insulator, planarizing a surface of the device isolation insulator by performing a planarization process, such as chemical mechanical polishing (CMP), to expose a surface of the recess mask, and recessing a top surface of the device isolation insulator by performing an etch-back process so that a top surface of the device isolation insulator is lower than a top surface of the fin active regions 120. The device isolation insulator may include silicon oxide.

The device isolation layer 130 may partially fill the trenches. For example, the device isolation layer 130 may fill lower portions of the trenches. Accordingly, parts of the fin active regions 120 may protrude from the surface of the device isolation layer 130. For example, lower portions of the fin active regions 120, i.e., side surfaces of lower fin active regions 120L, may be surrounded by the device isolation layer 130, and upper portions of the fin active regions 120, i.e., top and side surfaces of upper fin active regions 120U, may be exposed without being covered by the device isolation layer 130. The exposed top and side surfaces of the upper fin active regions 120U may be covered by gate patterns 140 that will be described below. Accordingly, the upper fin active regions 120U may operate as channel areas 125. The device isolation layer 130 may include first portions 130a that are covered by the gate patterns 140 and second portions 130b that are not covered by the gate patterns 140.

The preliminary gate patterns 140p may include sacrificial gate insulating patterns 146 on surfaces of the upper fin active regions 120U, sacrificial gate electrode patterns 147 on the sacrificial gate insulating patterns 146, and sacrificial gate capping patterns 148 on the sacrificial gate electrode patterns 147. Since the preliminary gate patterns 140p are formed, top and side surfaces of parts of the upper fin active regions 120U may be covered by the preliminary gate patterns 140p, and top and side surfaces of parts of the upper fin active regions 120U may be exposed without being covered by the preliminary gate patterns 140p. The sacrificial gate insulating patterns 146 may include thermally oxidized silicon or silicon oxide that is deposited by performing an atomic layer deposition (ALD) process. The sacrificial gate electrode patterns 147 may include polysilicon. The sacrificial gate capping patterns 148 may include silicon nitride.

Figure 4A:
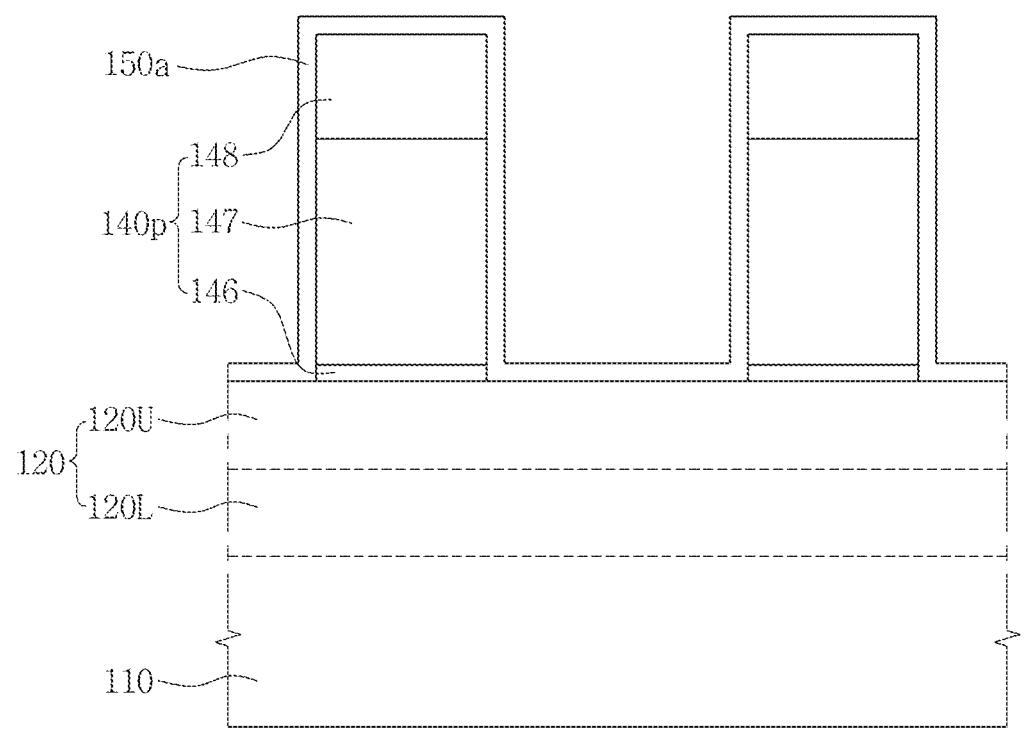
Figure 4B:
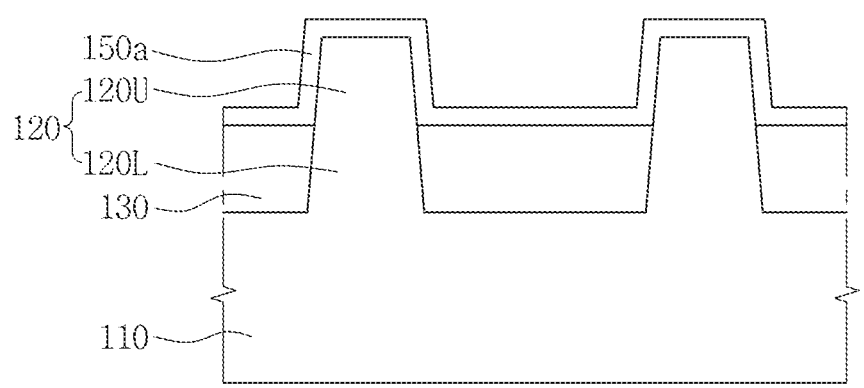

Referring to FIGS. 4A and 4B, the method may include conformally forming an inner spacer material layer 150a on top and side surfaces of the preliminary gate patterns 140p, the exposed top and side surfaces of the upper fin active regions 120U, and the device isolation layer 130. The inner spacer material layer 150a may include silicon oxide (SiO), silicon nitride (SiN), silicon oxynitride (SiON), or silicon oxycarbonitride (SiOCN). For example, the inner spacer material layer 150a may include silicon nitride (SiN). The inner spacer material layer 150a may be formed by performing an ALD process.

Figure 5A:
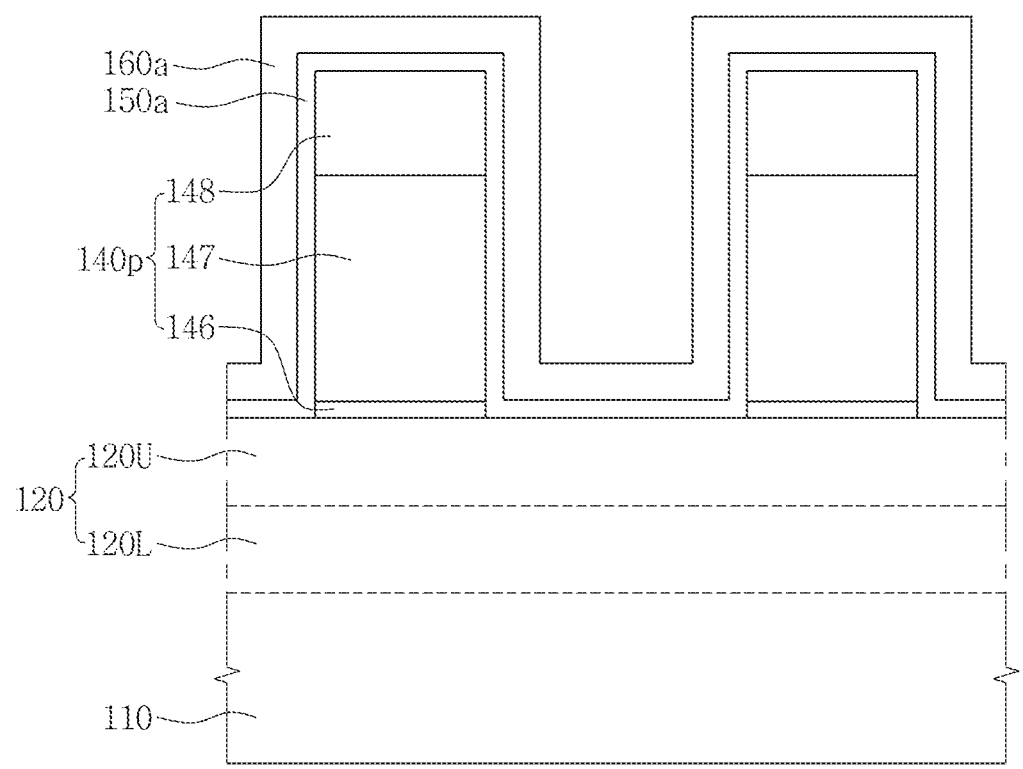
Figure 5B:
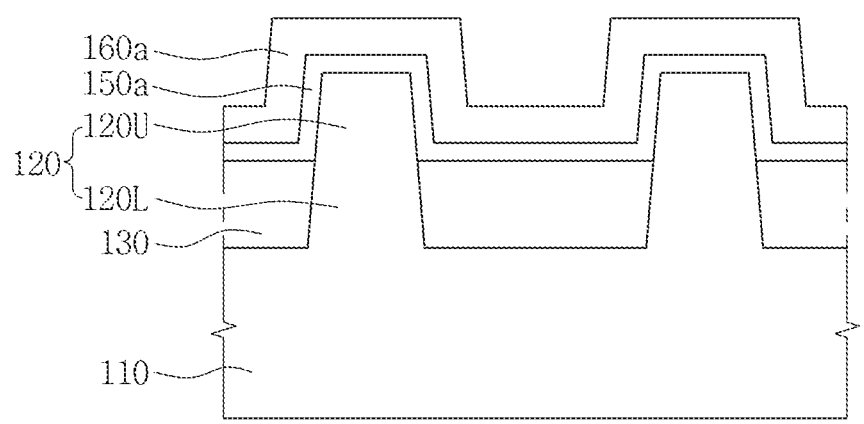

Referring to FIGS. 5A and 5B, the method may include conformally forming an outer spacer material layer 160a on the inner spacer material layer 150a. The outer spacer material layer 160a may include silicon oxide (SiO), silicon nitride (SiN), silicon oxynitride (SiON), or silicon oxycarbonitride (SiOCN). For example, the outer spacer material layer 160a may include silicon oxycarbonitride (SiOCN). The outer spacer material layer 160a may include silicon oxycarbonitride (SiOCN) that has carbon of less than or equal to 10 atomic %. Permittivity of the outer spacer material layer 160a is lower than permittivity of the inner spacer material layer 150a. The outer spacer material layer 160a may be formed by performing an ALD process.

Figure 6A:
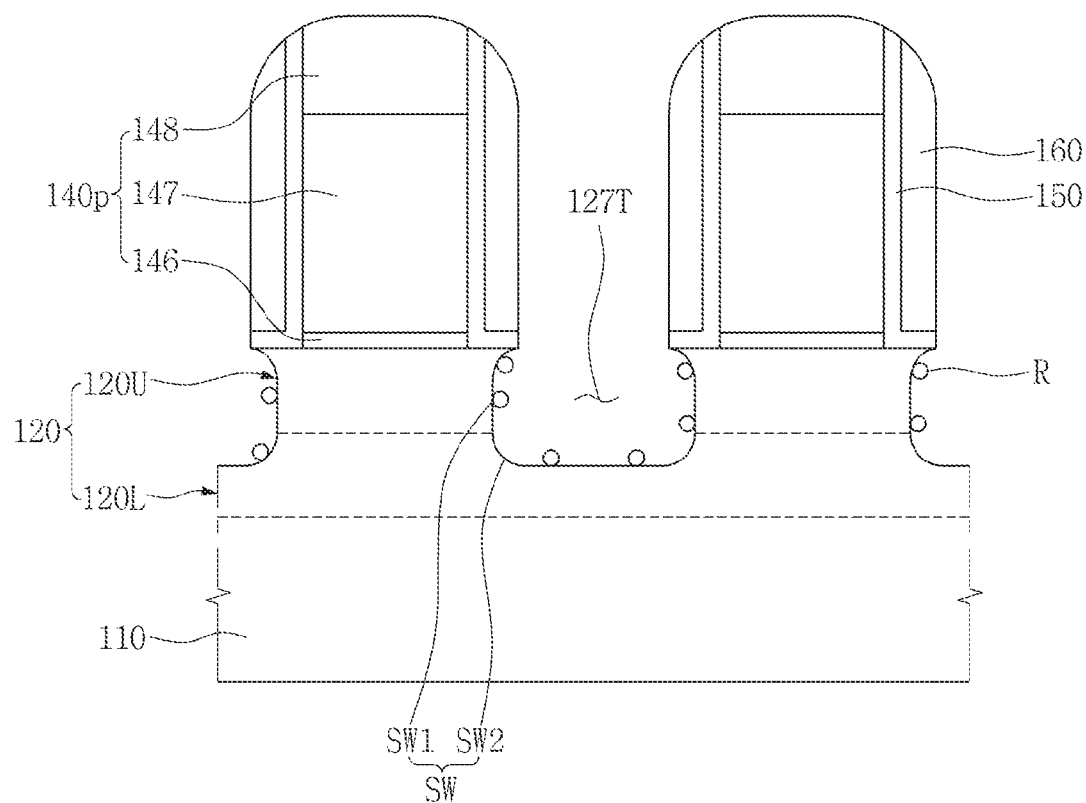
Figure 6B:
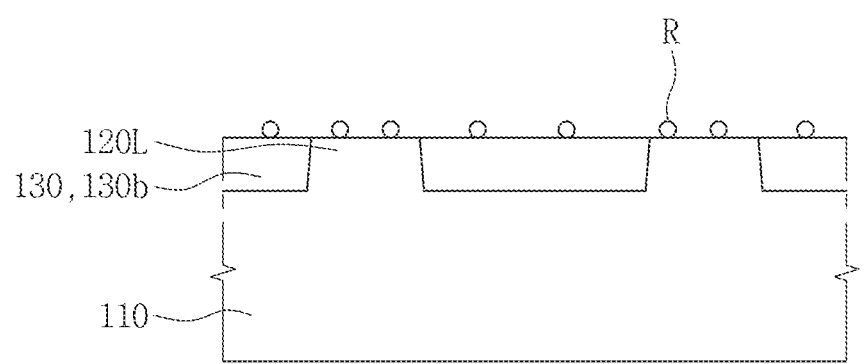
Figure 6C:
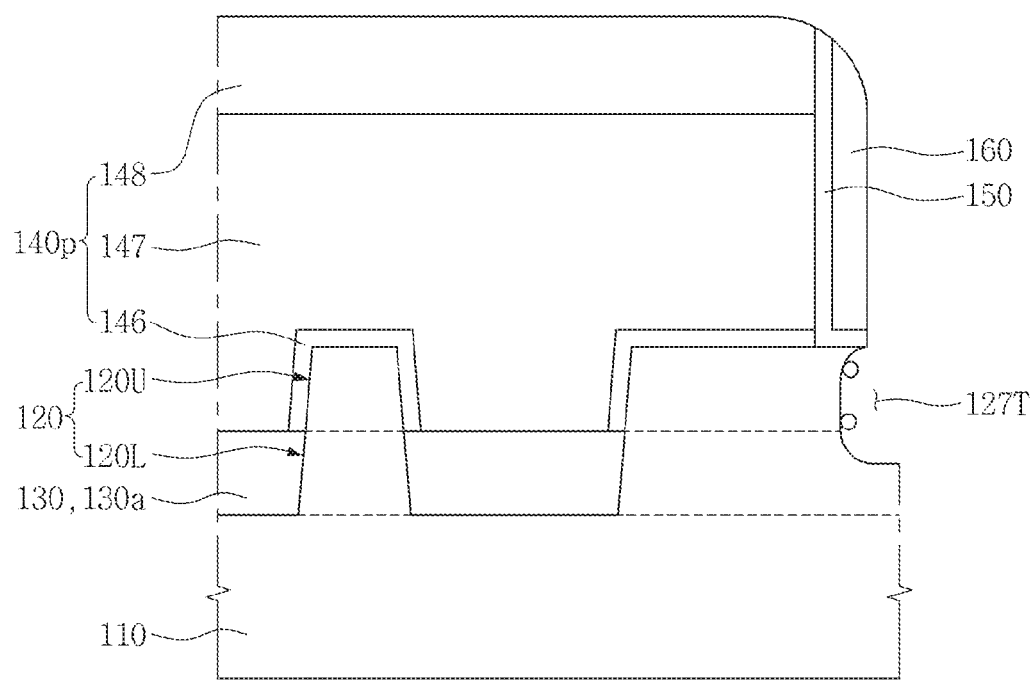

Referring to FIGS. 6A to 6C, the method may include forming source/drain trenches 127T by partially removing the outer spacer material layer 160a, the inner spacer material layer 150a, and the fin active regions 120 in which the preliminary gate patterns 140p is not disposed by performing an etching process. The source/drain trenches 127T may be formed between the preliminary gate patterns 140p. At this time, since the inner spacer material layer 150a and the outer spacer material layer 160a on top surfaces of the preliminary gate patterns 140p are removed, the sacrificial gate capping patterns 148 of the preliminary gate patterns 140p may be exposed. In this process, inner spacers 150 and outer spacers 160 on the preliminary gate patterns 140p may be formed.

Bottom surfaces of the source/drain trenches 127T may be located at a lower level than hypothetical boundaries (dotted line) between the upper fin active regions 120U and the lower fin active regions 120L. In other words, the bottom surfaces of the source/drain trenches 127T may be located in the lower fin active regions 120L. The bottom surfaces of the source/drain trenches 127T may be located at a lower level than top surfaces of the first portions 130a of the device isolation layer 130. The bottom surfaces of the source/drain trenches 127T may be coplanar with top surfaces of second portions 130b of the device isolation layer 130. Accordingly, the lower fin active regions 120L may be exposed to the bottom surfaces of the source/drain trenches 127T, and the upper fin active regions 120U and parts of the lower fin active regions 120L may be exposed to sidewalls of the source/drain trenches 127T.

The sidewalls SW of the source/drain trenches 127T may vertically overlap the inner spacers 150 and/or the outer spacers 160. The sidewalls SW of the source/drain trenches 127T may be convex toward the channel areas 125. The sidewalls SW of the source/drain trenches 127T may include first sidewalls SW1 that are located in the upper fin active regions 120U and second sidewalls SW2 that are located in upper portions of the lower fin active regions 120L. Vertical lengths of the second sidewalls SW2 are smaller than vertical lengths of the first sidewalls SW1. Upper end corners of the first sidewalls SW and lower end corners of the second sidewalls SW2 may be round shapes.

After performing the etching process, residues R may remain on the inner walls of the source/drain trenches 127T. For example, the residues R may include carbon (C), oxygen (O), and/or silicon (Si). The carbon (C) may be coming out from the outer spacers 160. When the residues R including the carbon (C) remaining on the inner walls of the source/drain trenches 127T, the stacking faults of an epitaxial growth layer in a subsequent process may occur. Accordingly, growth of the epitaxial layers may be declined locally.

Figure 7A:
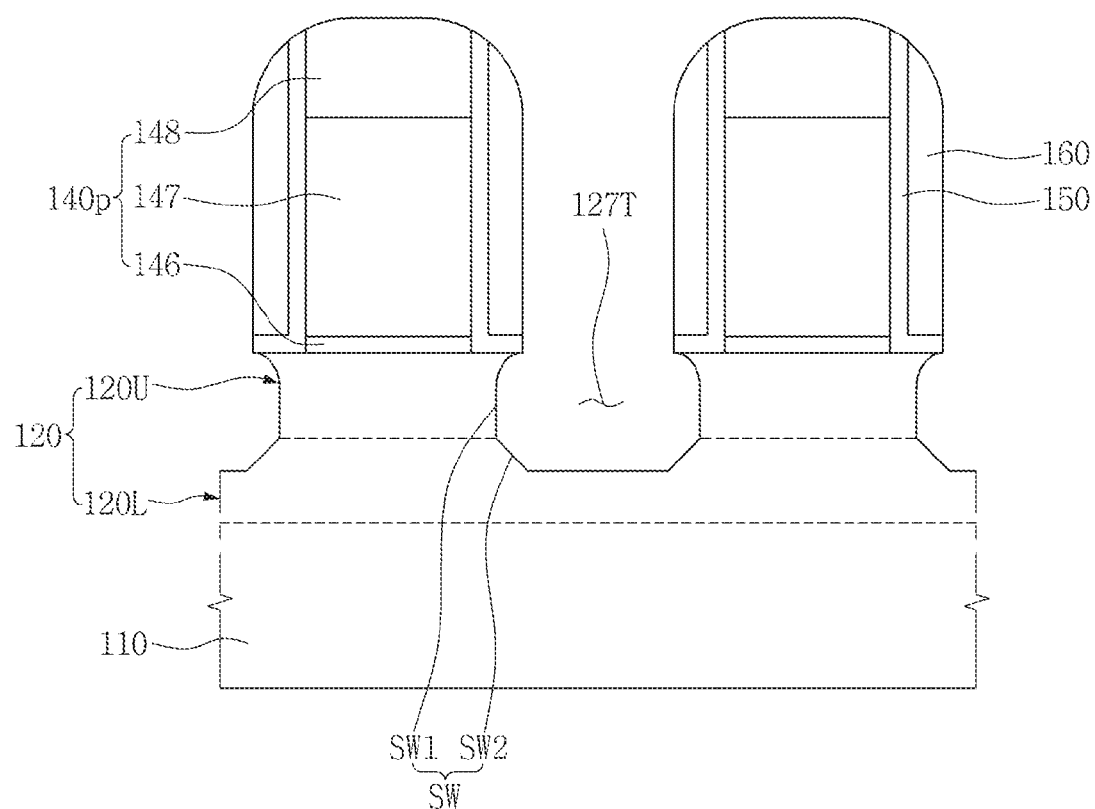
Figure 7B:
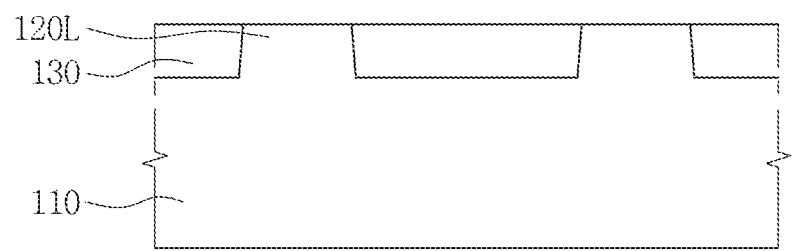
Figure 7C:
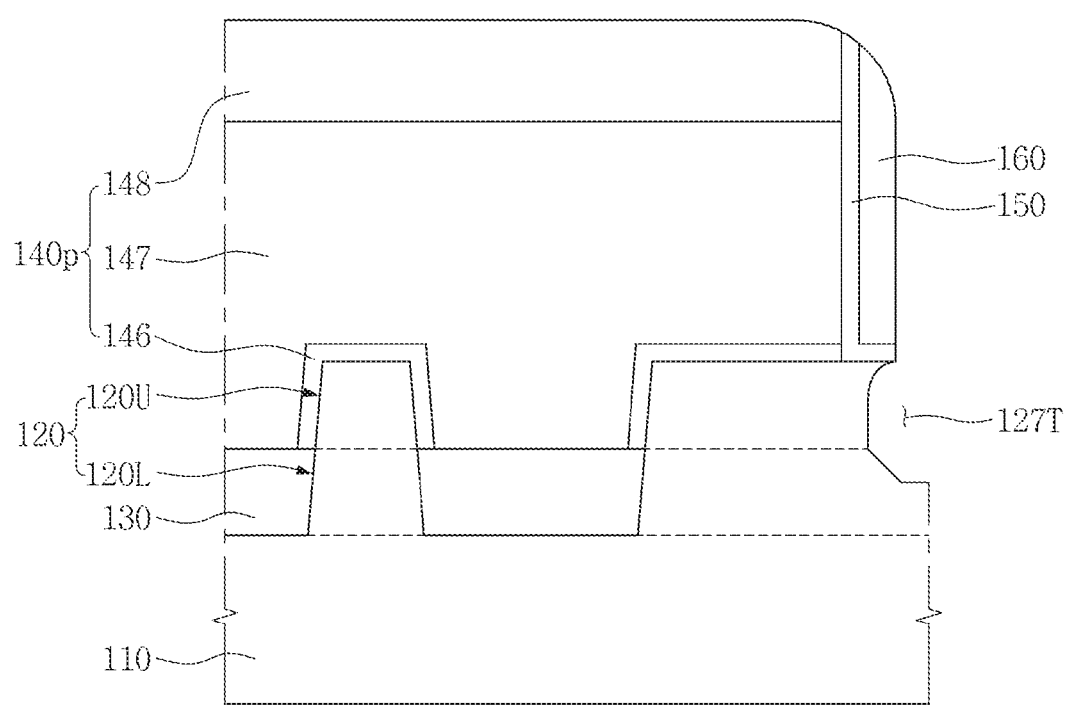

Referring to FIGS. 7A to 7C, the method may include removing the residues R remaining on the inner walls of the source/drain trenches 127T by performing a hydrogen bake treatment and a hydrogen plasma treatment, and transforming the second sidewalls SW2 of the source/drain trenches 127T to inclined {111} planes. At this time, the second sidewalls SW2 may be transformed to the inclined {111} planes by shrinking by the energy applied to inner surfaces of the source/drain trenches 127T during the hydrogen bake treatment.

The second sidewalls SW2 of the source/drain trenches 127T having the inclined {111} planes may be located at a lower level than hypothetical boundaries (dotted line) between the upper fin active regions 120U and the lower fin active regions 120L. In other words, the second sidewalls SW2 of the source/drain trenches 127T having the inclined {111} planes may be located in the lower fin active regions 120L, and then the second sidewalls SW2 of the source/drain trenches 127T having the inclined {111} planes may not horizontally overlap the channel areas 125. Accordingly, since distances between the source/drain trenches 127T that are located at both sides of the channel areas 125 may be almost constant from upper ends of the source/drain trenches 127T to lower ends of the source/drain trenches 127T, compressive strain may be uniformly applied to the entire channel areas 125. Accordingly, hole mobility with respect to the entire channel areas 125 may be increased, and then the performance of the semiconductor device may be improved.

The hydrogen bake treatment may be performed at a temperature of 750 to 830° C., at a pressure of 100 to 300 torr, and for a period of 30 seconds to 10 minutes. At this time, the temperature may raise to a ramping rate of 0.1 to 10° C. from 500° C. The hydrogen plasma treatment may be performed in power of 5 to 50 kW, at a temperature of 300 to 700° C., at a frequency of about 0.5 to 5 GHz, and for a period of 5 seconds to 10 minutes.

By cleaning surfaces of the inner walls of the source/drain trenches 127T by performing the hydrogen bake treatment and the hydrogen plasma treatment to remove the residues R on the inner walls of the source/drain trenches 127T, epitaxial layers are formed by a subsequent process may be uniformly grown without stacking faults.

Also, by transforming the second sidewalls SW2 of the source/drain trenches 127T to the inclined {111} planes by performing the hydrogen bake treatment, critical thicknesses of the epitaxial layers to be formed by a subsequent process may be increased. Accordingly, a problem that the stacking faults caused by an increase in the thicknesses of the epitaxial growth layers over the critical thicknesses can be overcome.

Figure 8A:
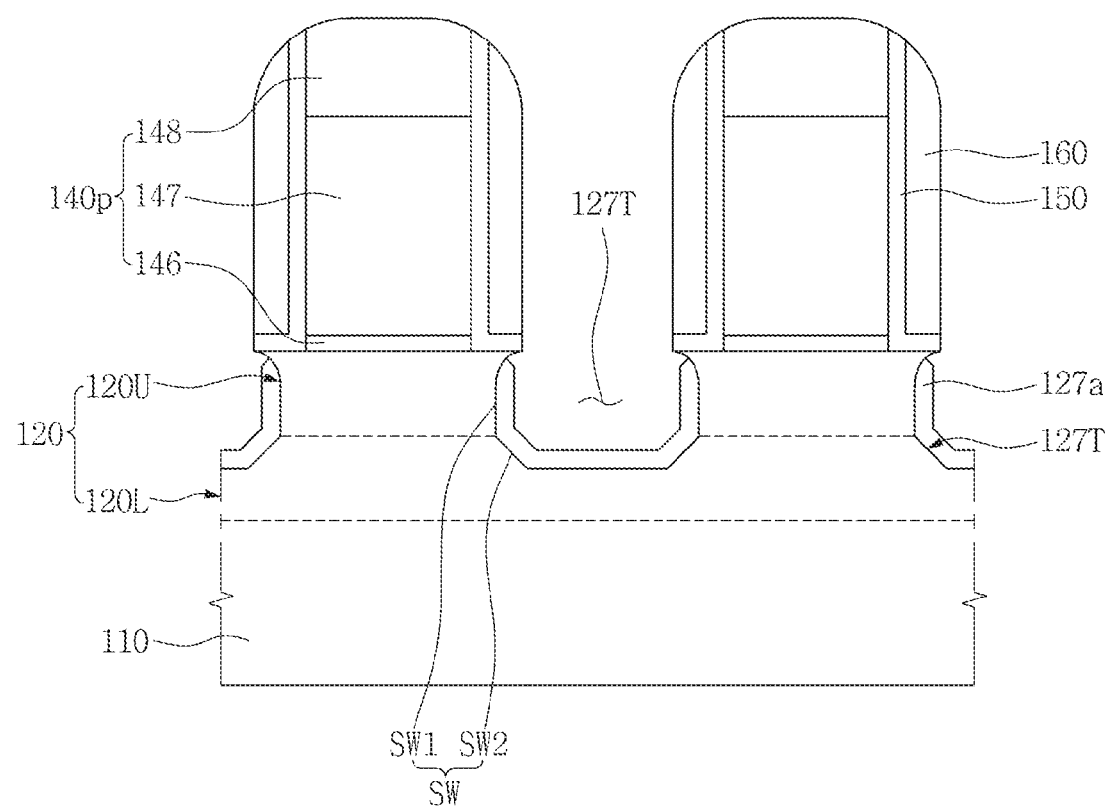
Figure 8B:
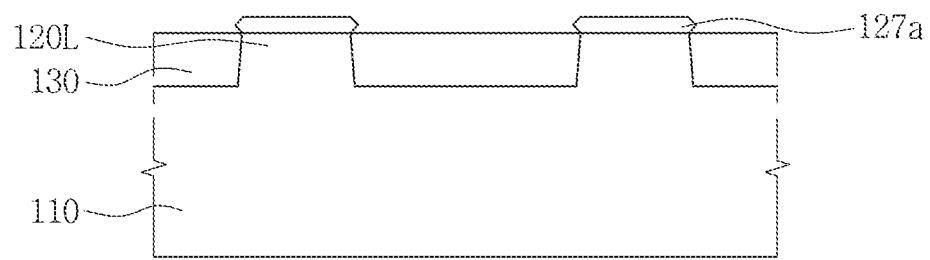
Figure 8C:
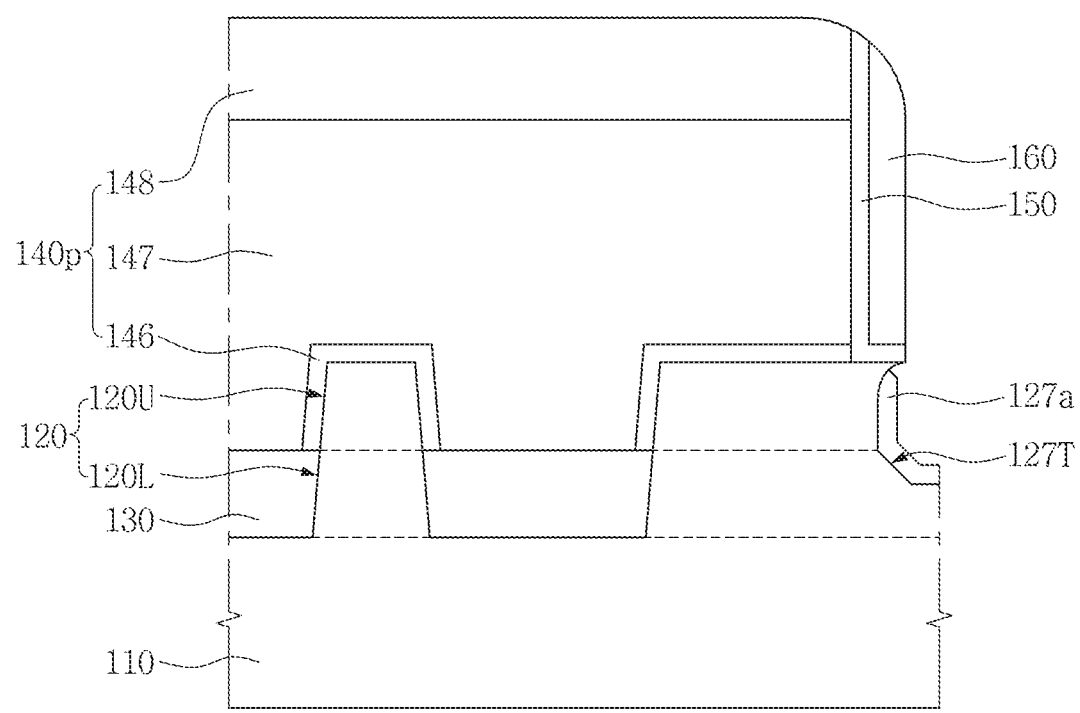

Referring to FIGS. 8A to 8C, the method may include conformally forming first epitaxial layers 127a on the inner walls of the source/drain trenches 127T by performing a selective epitaxial growth (SEG) process. At this time, the first epitaxial layers 127a may not be formed on upper ends of the inner walls of the source/drain trenches 127T. The first epitaxial layers 127a may include single crystalline silicon germanium (SiGe). For example, the first epitaxial layers 127a may include SiGe that has germanium at a content less than or equal to 30%. Since the residues R remaining on the inner walls of the source/drain trenches 127T are removed in the previous process, the first epitaxial layers 127a may be evenly formed on the inner walls of the source/drain trenches 127T.

Figure 9A:
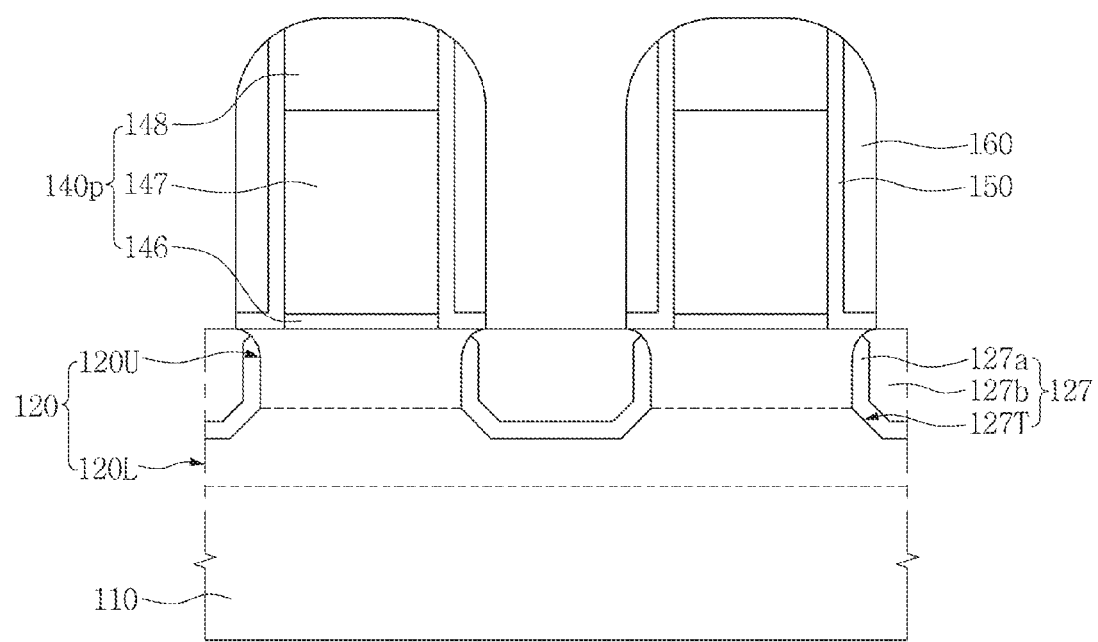
Figure 9B:
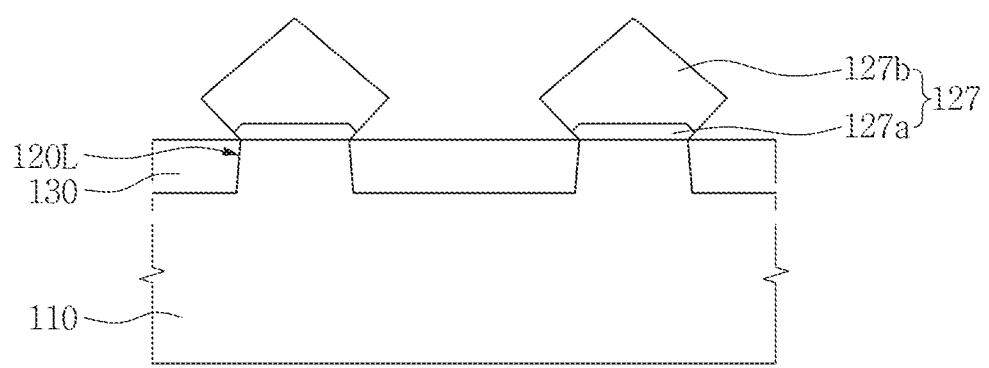
Figure 9C:
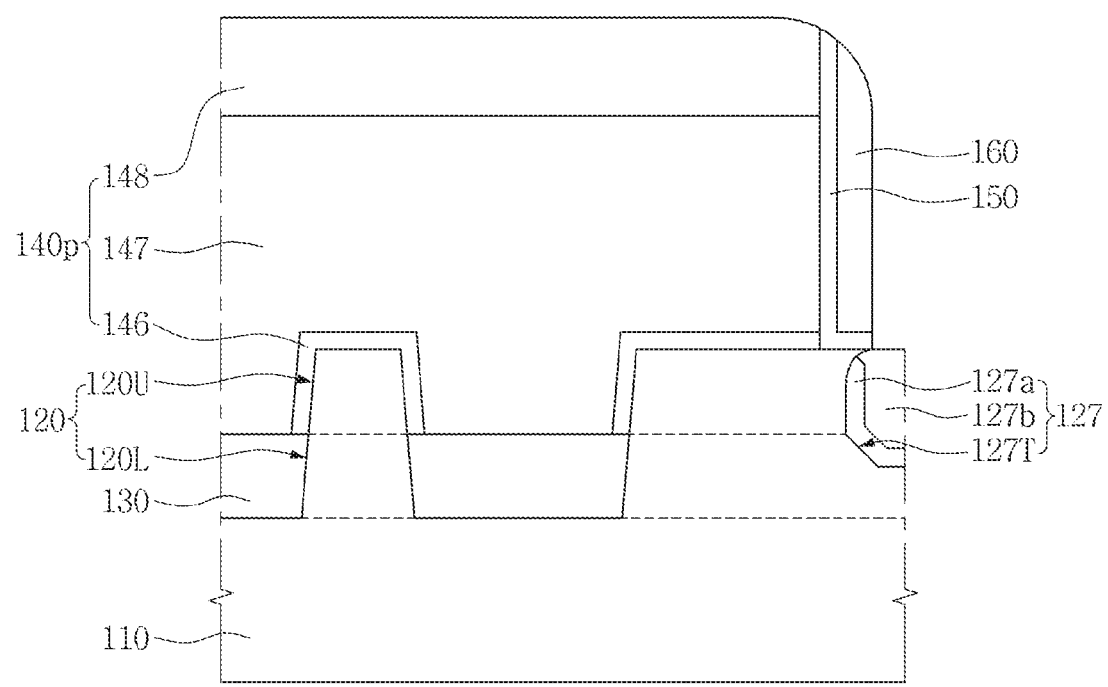

Referring to FIGS. 9A to 9C, the method may include forming second epitaxial layers 127b on the first epitaxial layers 127a by performing a SEG process to fill the source/drain trenches 127T. Since the first epitaxial layers 127a are not formed on the upper ends of the inner walls of the source/drain trenches 127T, outer edges of upper ends of the second epitaxial layers 127b may be in direct contact with the inner walls of the source/drain trenches 127T. Accordingly, the second epitaxial layers 127b may be in direct contact with the fin active regions 120. The second epitaxial layers 127b may include single crystalline silicon germanium (SiGe). The second epitaxial layers 127b may include SiGe that has the germanium at a higher content than the first epitaxial layers 127a. For example, the second epitaxial layers 127b may include the SiGe that has germanium at a content more than or equal to 30%.

Figure 10A:
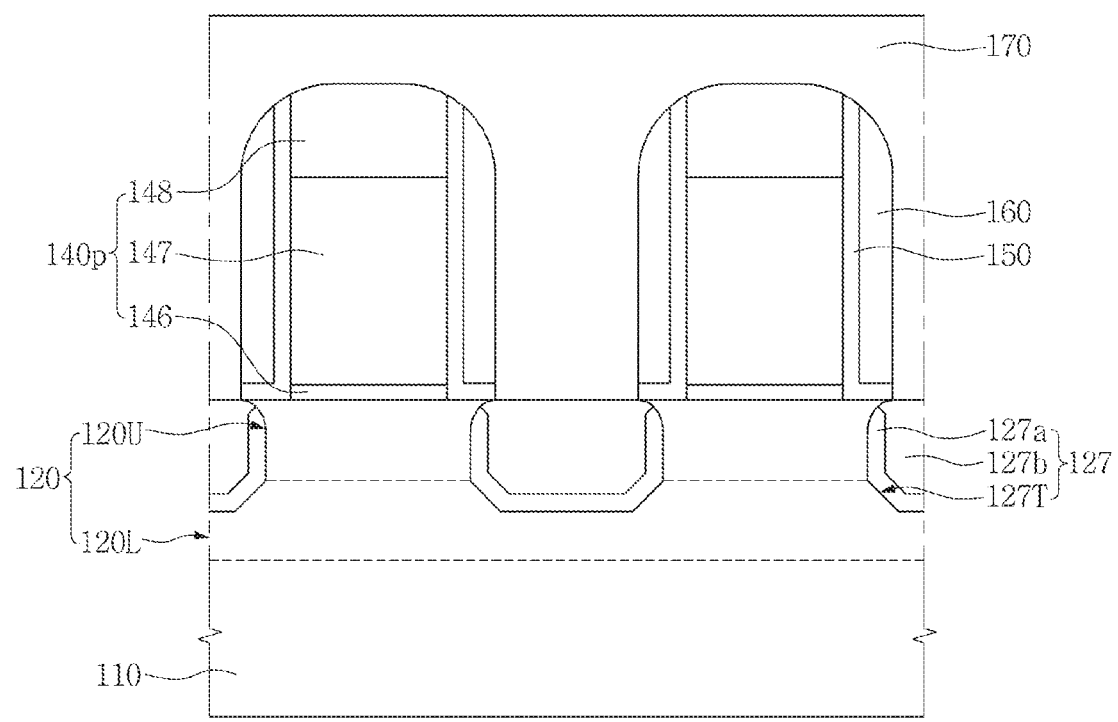
Figure 10B:
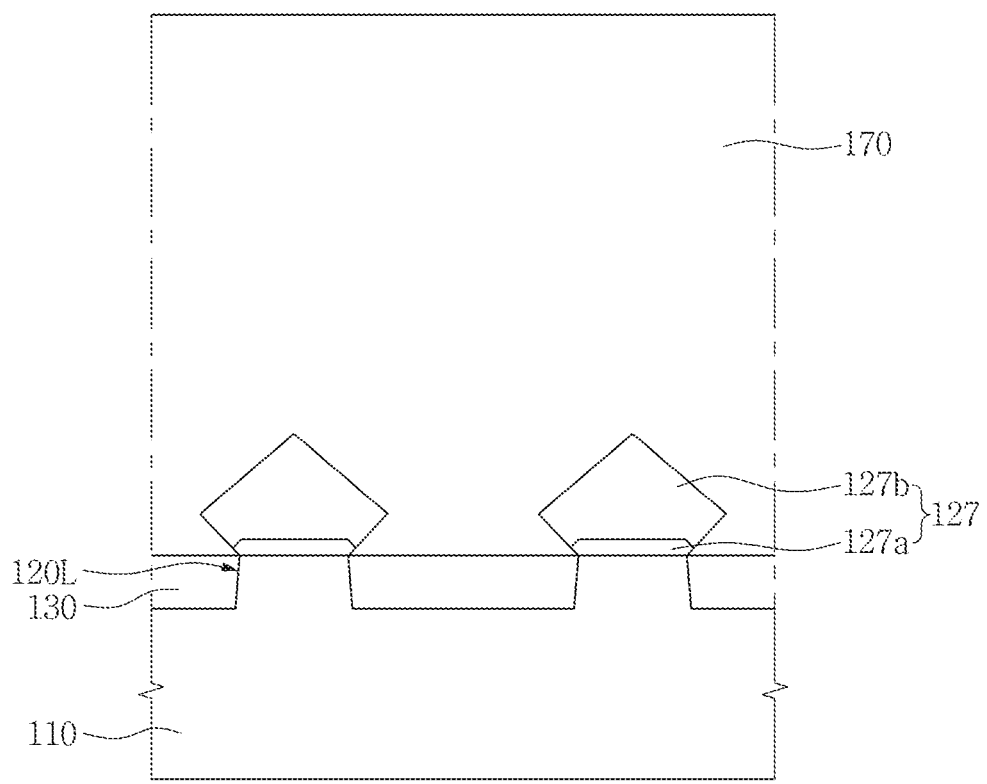
Figure 10C:
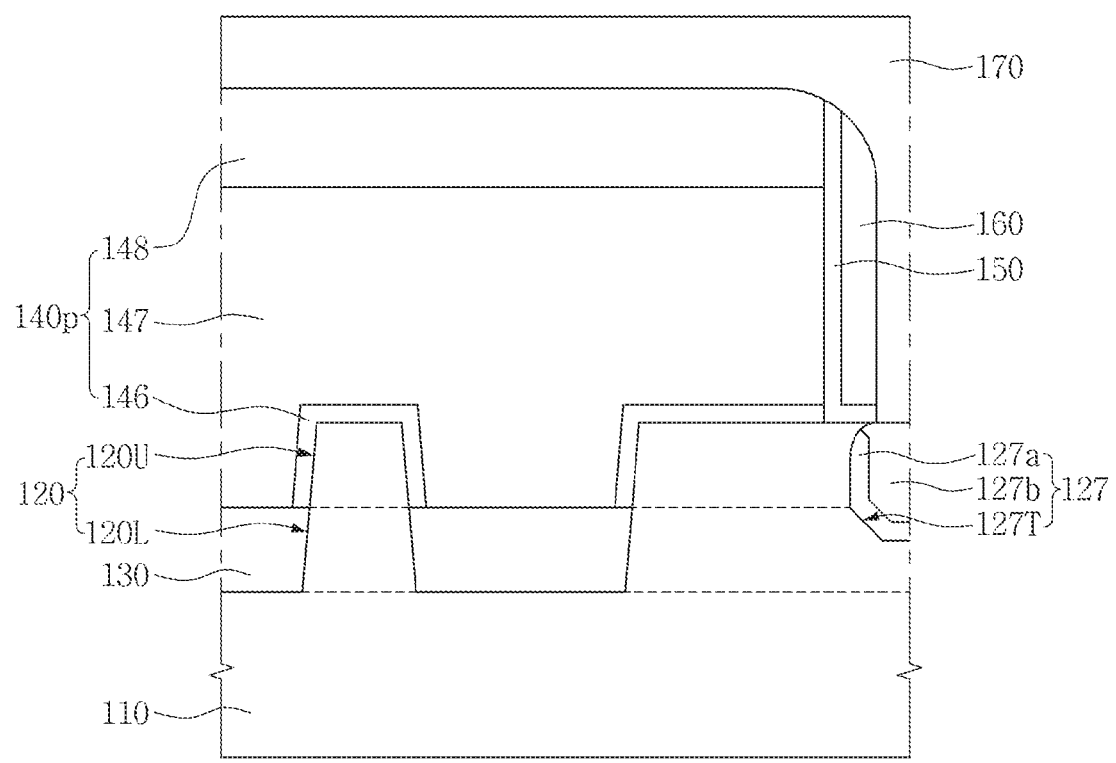

Referring to FIGS. 10A to 10C, the method may include forming a lower interlayer insulating layer 170 by performing a deposition process. The lower interlayer insulating layer 170 may include silicon oxide.

Figure 11A:
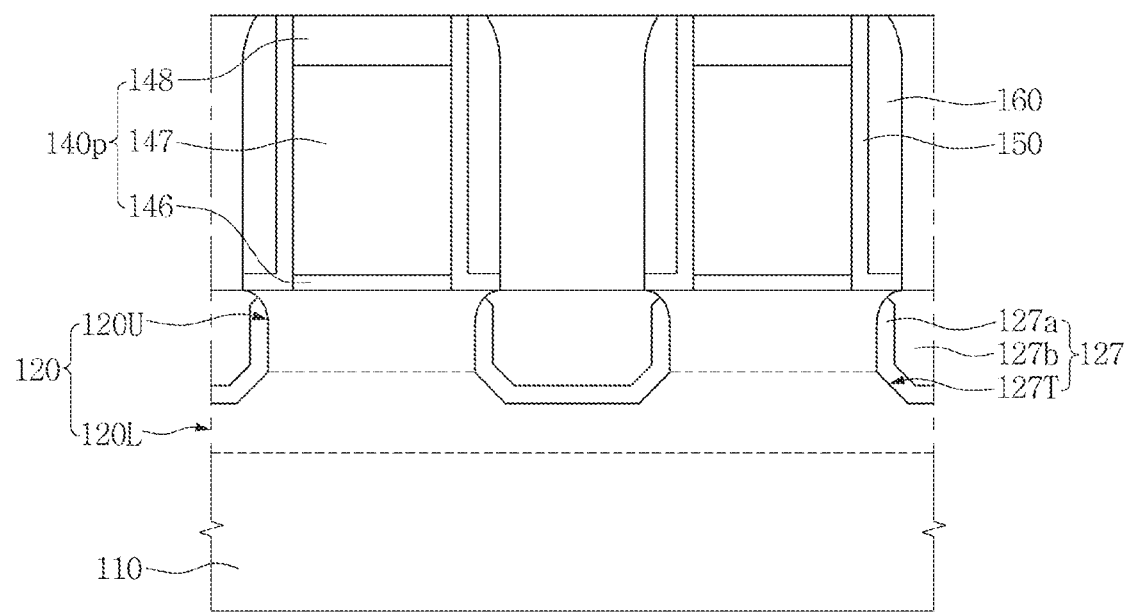
Figure 11B:
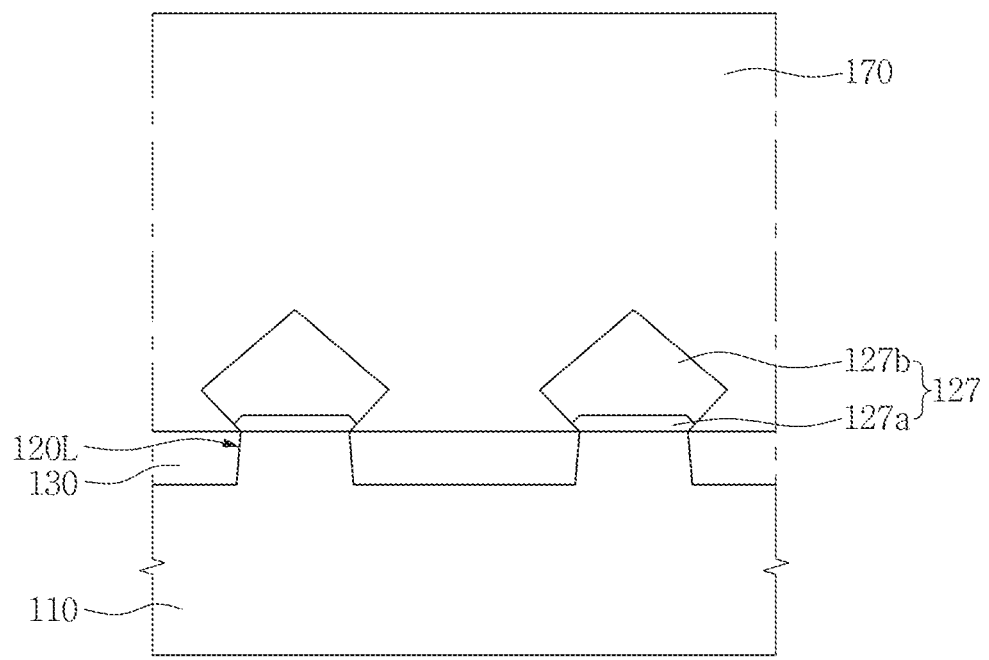
Figure 11C:
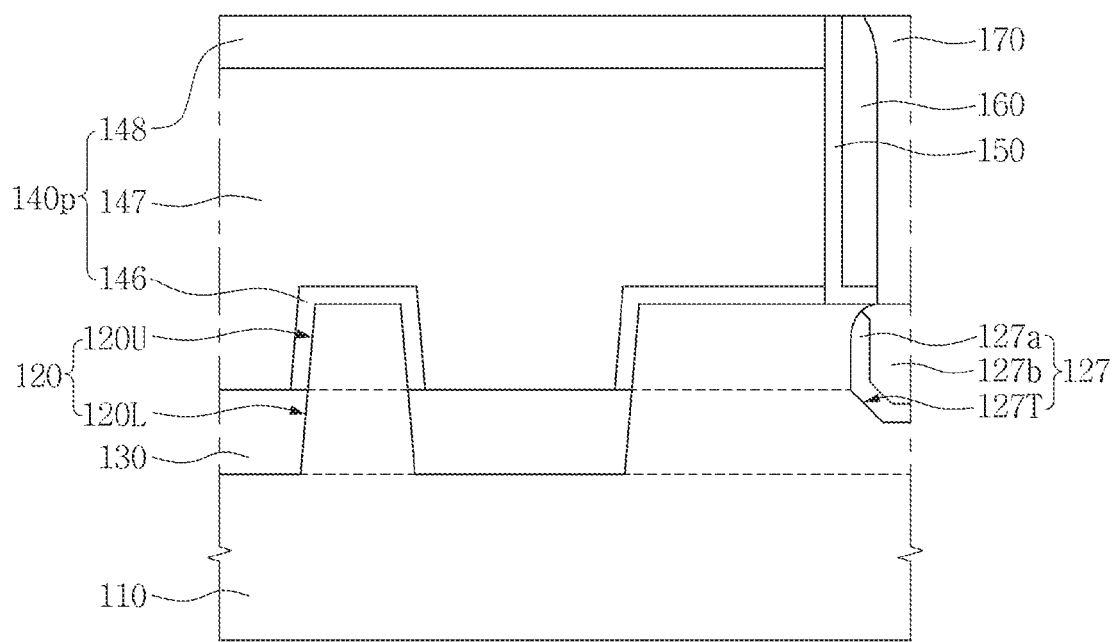

Referring to FIGS. 11A to 11C, the method may include removing the lower interlayer insulating layer 170 on the preliminary gate patterns 140p by performing a planarization process such as a CMP process to expose surfaces of the sacrificial gate capping patterns 148 of the preliminary gate patterns 140p. The CMP process may include removing silicon oxide and employing silicon nitride as a stopping layer.

Figure 12A:
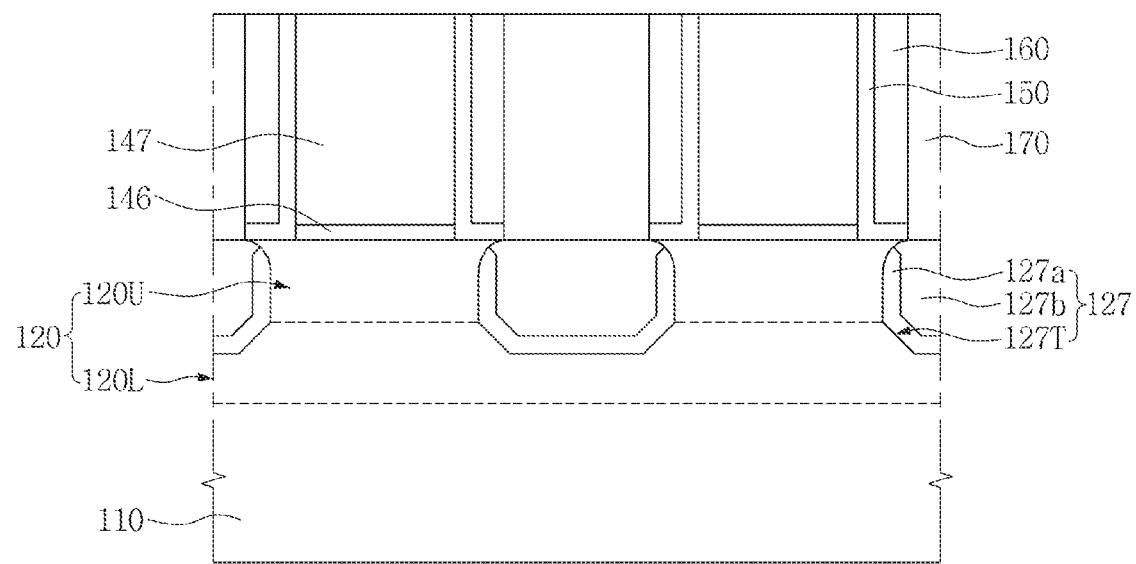
Figure 12B:
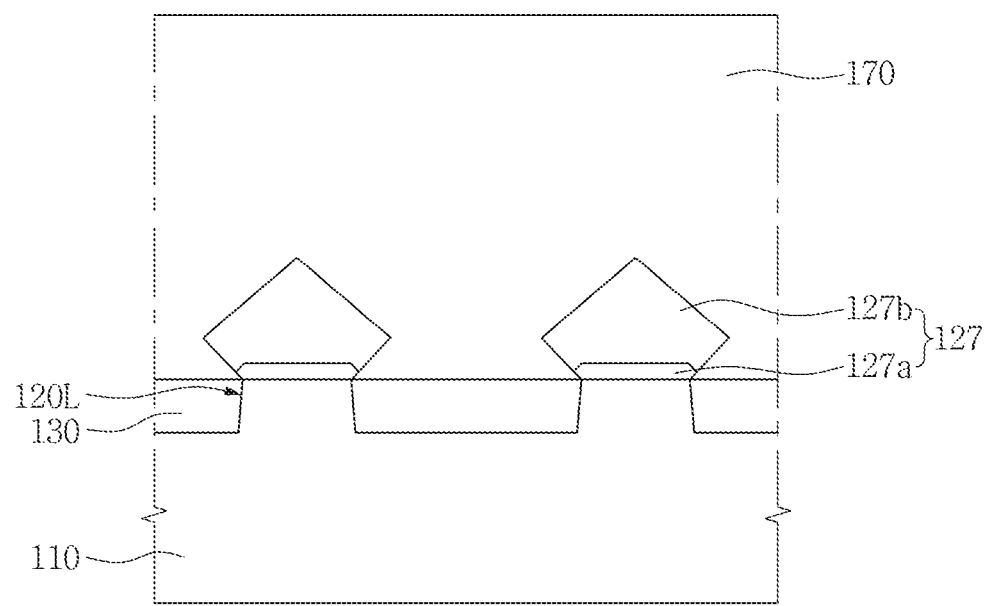
Figure 12C:
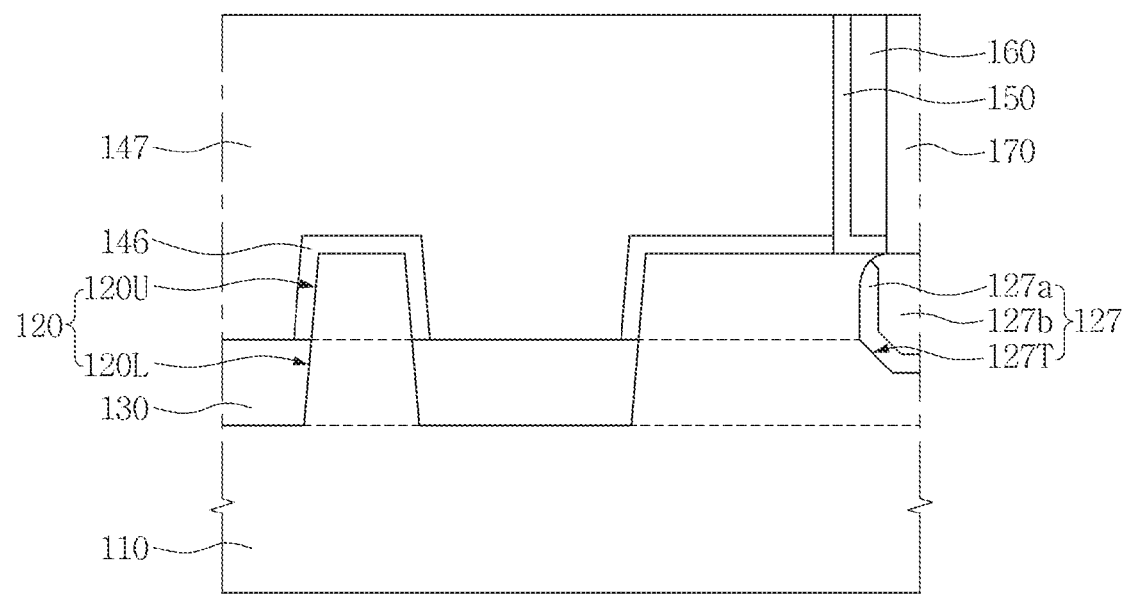

Referring to FIGS. 12A to 12C, the method may include exposing surfaces of the sacrificial gate electrode patterns 147 of the preliminary gate patterns 140p by repeating or continuously performing the planarization process such as the CMP process. Accordingly, top surfaces of the sacrificial gate electrode patterns 147, the inner spacers 150, the outer spacers 160, and the lower interlayer insulating layer 170 may be coplanar. The CMP process may include removing silicon oxide and silicon nitride and employing silicon as a stopping layer.

Figure 13A:
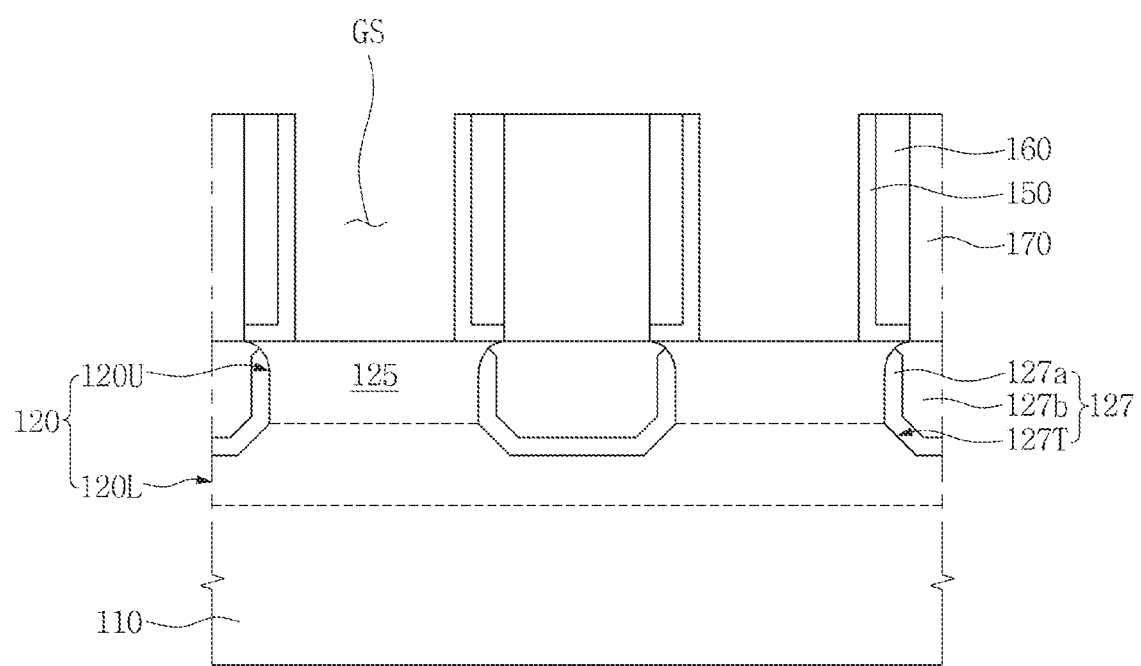
Figure 13B:
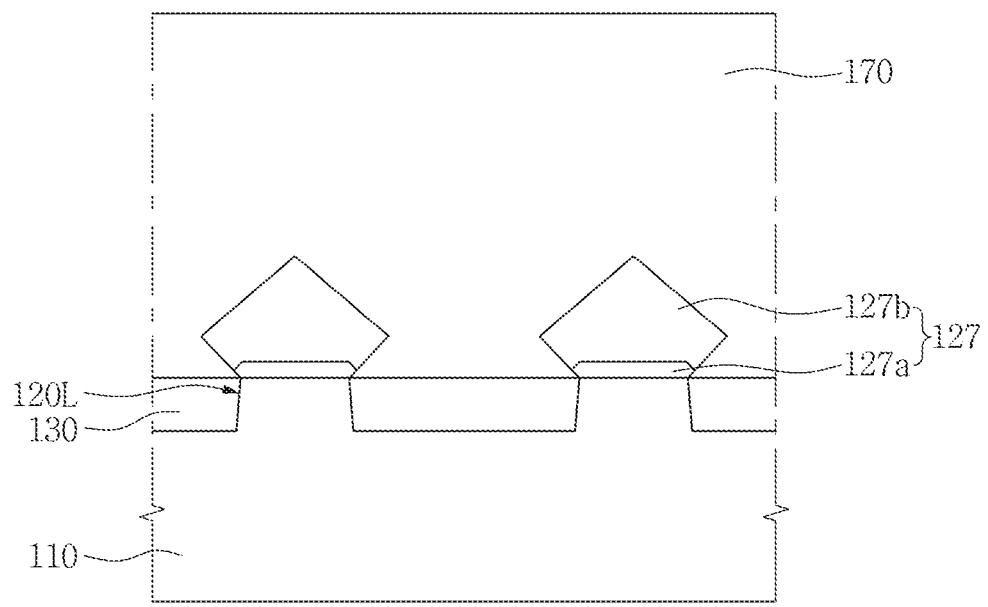
Figure 13C:
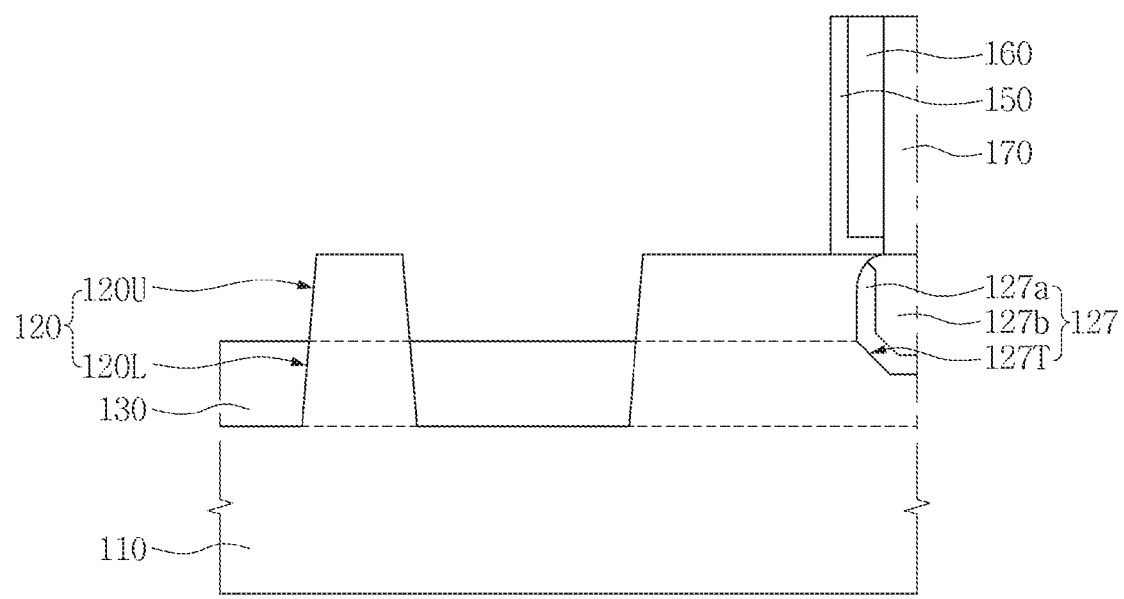

Referring to FIGS. 13A to 13C, the method may include forming gate pattern spaces GS exposing surfaces of the fin active regions 120 and inner side surfaces of the inner spacers 150 by removing the exposed the sacrificial gate electrode patterns 147 and the sacrificial gate insulating patterns 146 by performing an etching process.

Figure 14A:
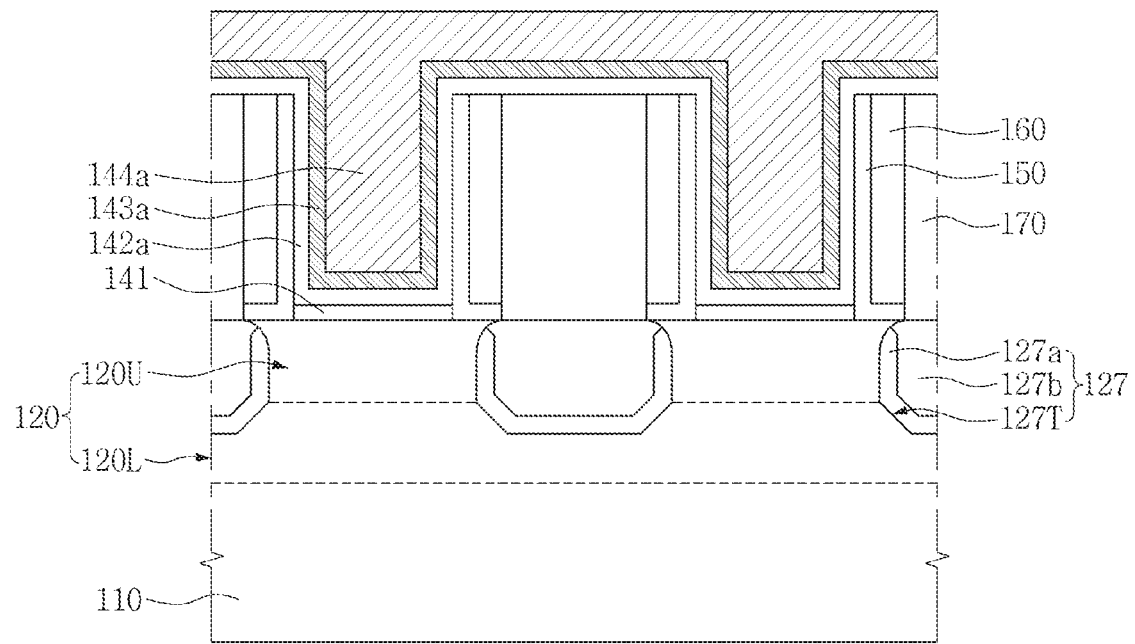
Figure 14B:
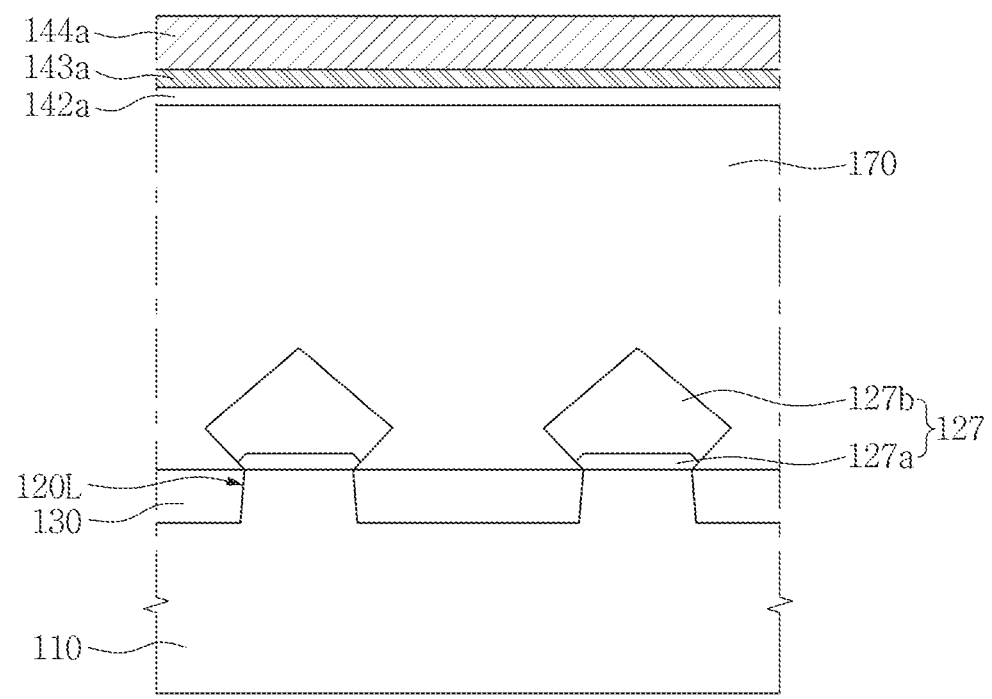
Figure 14C:
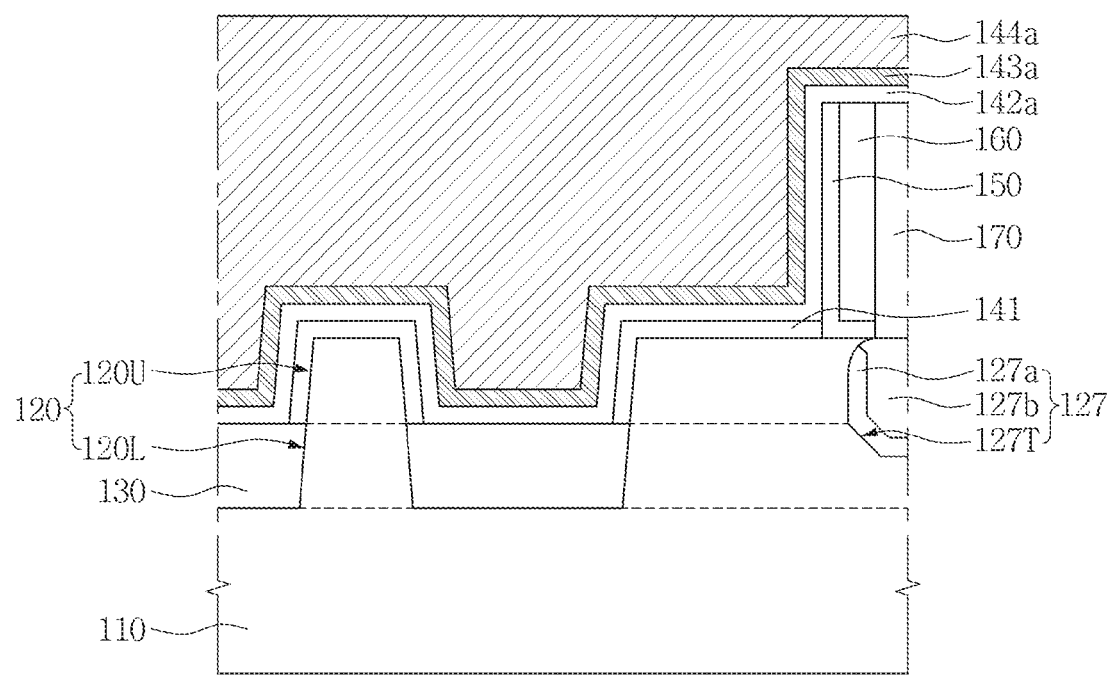

Referring to FIGS. 14A to 14C, the method may include forming surface insulating patterns 141, a gate insulating layer 142a, a gate barrier layer 143a, and a gate electrode layer 144a in the gate pattern spaces GS.

The surface insulating patterns 141 may include a natural oxide layer that is formed by oxidizing the surfaces of the fin active regions 120, thermally oxidized silicon, or silicon oxide that is deposited by performing an ALD process.

The gate insulating layer 142a may be conformally formed on inner side surfaces of the exposed the inner spacers 150, surfaces of the surface insulating patterns 141, the top surfaces of the inner spacers 150, the top surfaces of the outer spacers 160, and the top surface of the lower interlayer insulating layer 170 by performing a deposition process. The gate insulating layer 142a may include a high-k dielectric insulator, such as hafnium oxide (HfO), aluminum oxide (AlO), zirconium oxide (ZrO), lanthanum oxide (LaO), or another metal oxide.

The gate barrier layer 143a may be conformally formed on the gate insulating layer 142a by performing a deposition process. The gate barrier layer 143a may include a barrier metal, such as titanium (Ti), titanium nitride (TIN), tantalum (Ta), tantalum nitride (TaN), or titanium tungsten (TiW).

The gate electrode layer 144a may be formed on the gate barrier layer 143a by performing a deposition process to fill the gate pattern spaces GS. The gate electrode layer 144a may include a metal, such as tungsten (W).

Figure 15A:
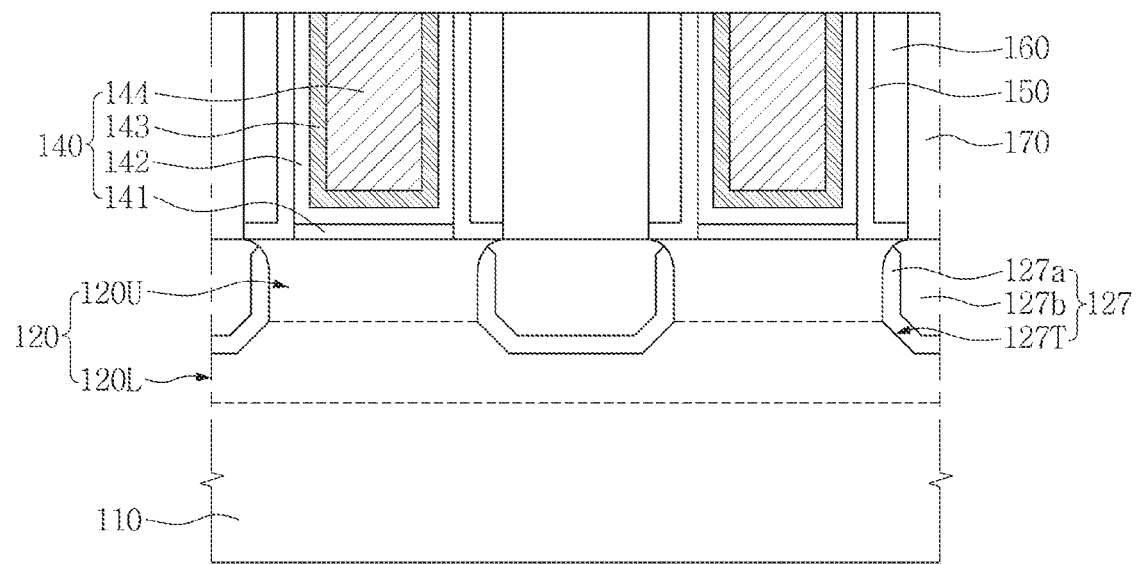
Figure 15B:
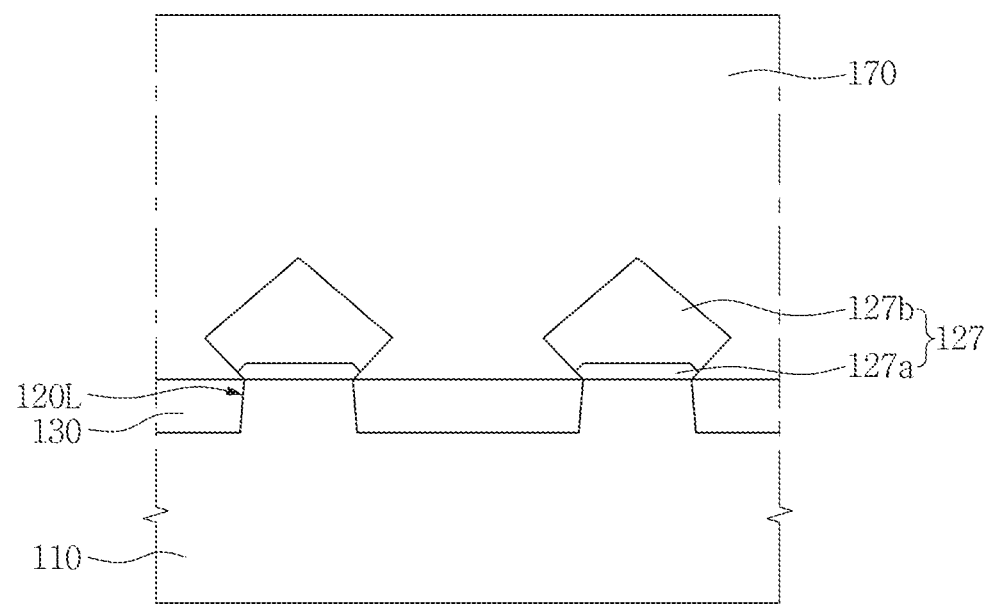
Figure 15C:
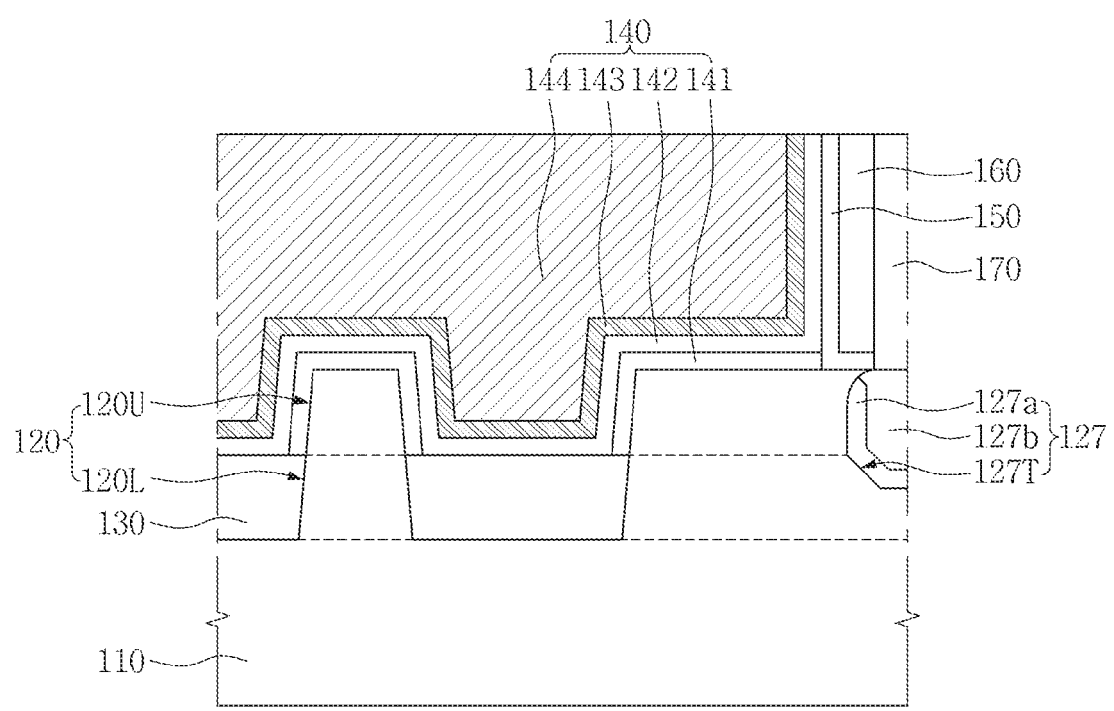

Referring to FIGS. 15A to 15C, the method may include forming gate patterns 140 that include gate insulating patterns 142, gate barrier patterns 143, and gate electrode patterns 144 by removing the gate electrode layer 144a, the gate barrier layer 143a, and gate insulating layer 142a on the lower interlayer insulating layer 170 by performing a planarization process, such as a CMP process.

Referring again to FIGS. 2A to 2C, the method may include entirely forming an upper interlayer insulating layer 180. The upper interlayer insulating layer 180 may include silicon oxide. In addition, before forming the upper interlayer insulating layer 180, the method may further include forming a stopper layer 175 on the gate patterns 140 and the lower interlayer insulating layer 170. The stopper layer 175 may include silicon nitride.

Figure 16:
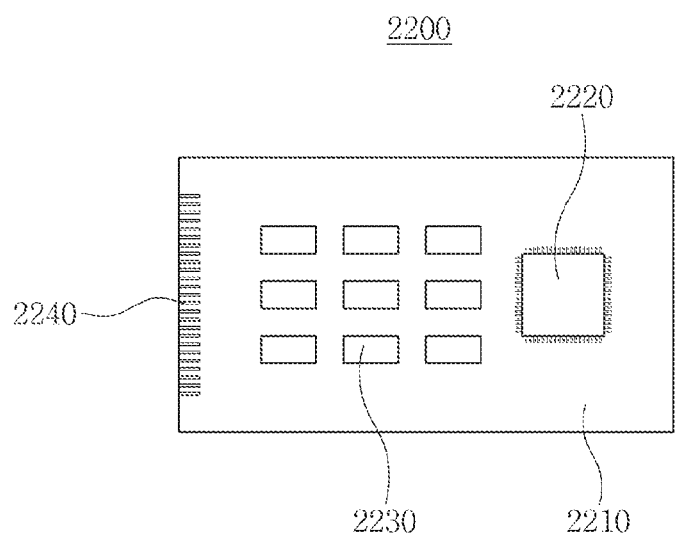
FIG. 16 is a diagram conceptually showing a semiconductor module according to an embodiment of the inventive concepts.

FIG. 16 is a diagram conceptually showing a semiconductor module 2200 in accordance with an embodiment of the inventive concepts. Referring to FIG. 16, the semiconductor module 2200 in accordance with the embodiment of the inventive concepts may include a processor 2220 and semiconductor devices 2230 mounted on a module substrate 2210. The processor 2220 or the semiconductor devices 2230 may include the semiconductor device 100 according to the embodiment of the inventive concepts. Conductive input/output terminals 2240 may be disposed on at least one side of the module substrate 2210.

Figure 17:
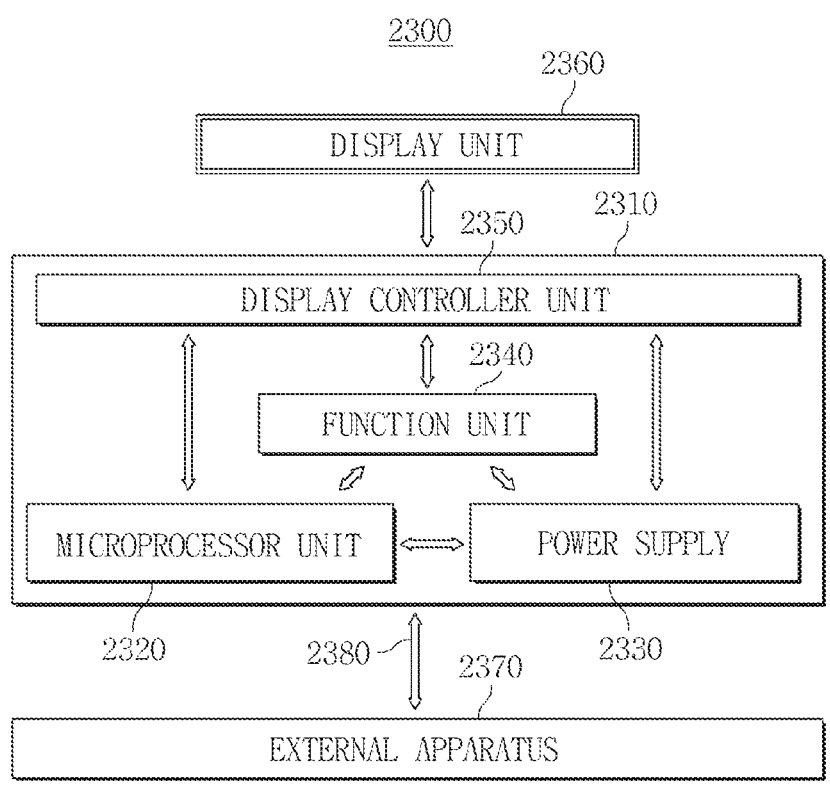
FIGS. 17 and 18 are block diagrams conceptually showing electronic systems according to embodiments of the inventive concepts.

FIG. 17 is a block diagram conceptually showing an electronic system 2300 in accordance with an embodiment of the inventive concepts. Referring to FIG. 17, the electronic system 2300 in accordance with the embodiment of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a printed circuit board (PCB) and/or a case. The microprocessor unit 2320, the power supply 2330, the function unit 2340, and the display controller unit 2350 may be mounted or disposed on a top surface or an inside of the body 2310. The display unit 2360 may be disposed on the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a central processing unit (CPU) or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions. The microprocessor unit 2320 or the function unit 2340 may include the semiconductor device 100 according to the embodiment of the inventive concepts.

Figure 18:
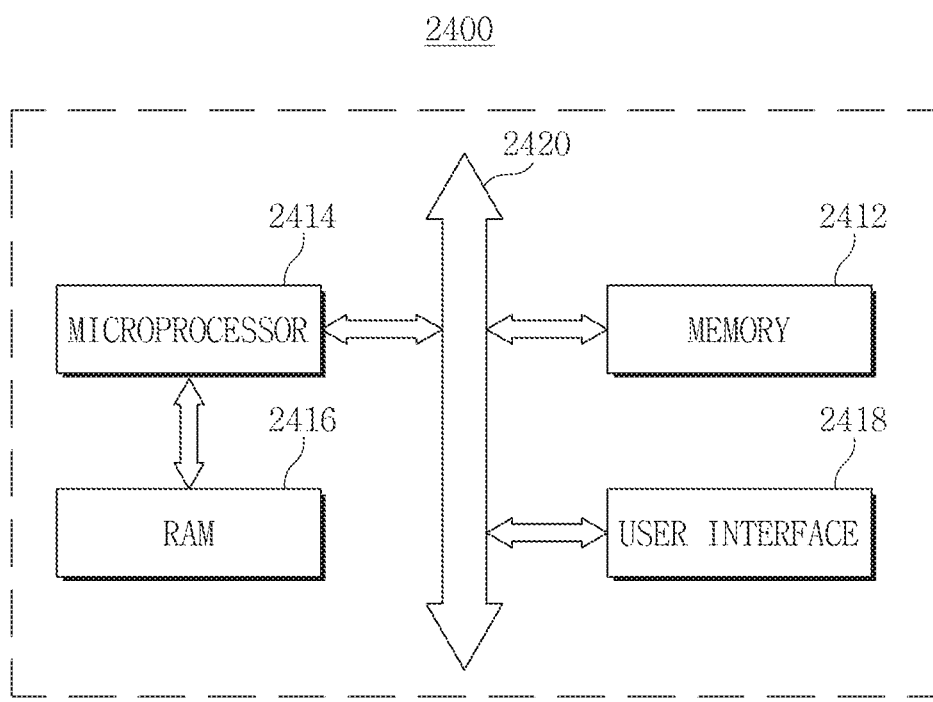

Referring to FIG. 18, an electronic system 2400 in accordance with an embodiment of the inventive concepts may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include the semiconductor device 100 according to the embodiment of the inventive concepts.

A semiconductor device according to the embodiment of the inventive concepts can include a trench having a lower sidewall that has inclined {111} planes. Accordingly, a critical thickness of an epitaxial layer that is formed in the trench can be increased. As a result, since a thickness of an epitaxial growth layer does not exceed the critical thickness, a problem that stacking faults occur in the epitaxial growth layer can be overcome.

Further, in the semiconductor device according to the embodiment of the inventive concepts, a decrease of compressive strain that is applied to a channel area can be reduced or prevented according to a reduction in the problem that the stacking fault occurs in the epitaxial growth layer. As a result, a performance of a semiconductor device can be improved by increasing hole mobility in the channel area.

Furthermore, in the semiconductor device according to the embodiment of the inventive concepts, the lower sidewall having the inclined {111} planes can be located at a lower level than the channel area. Accordingly, a distance between side surfaces of source/drain trenches being in contact with both sides of the channel area can be almost constant from an upper end of the channel area to a lower end of the channel area. As a result, the compressive strain can be uniformly applied to the entire channel area.

Other various effects have been described in the above detailed descriptions.

Although a few embodiments have been described, those skilled in the art will readily appreciate that many modifications are possible without departing from the novel teachings and advantages. Accordingly, all such modifications are intended to be included within the scope of this inventive concepts as defined in the claims.

What is claimed is:

1. A semiconductor device comprising:
   a fin active region including a lower fin active region surrounded by a device isolation layer and an upper fin active region that protrudes from a top surface of the device isolation layer;
   a gate pattern on top and side surfaces of the upper fin active region, and extending above the device isolation layer; and
   a source/drain region in the fin active region at a side of the gate pattern,
   wherein the source/drain region includes a trench and epitaxial layers filling the trench,
      wherein the trench includes a bottom surface and sidewalls,
         wherein the sidewalls include first sidewalls and second sidewalls, the second sidewalls connecting the first sidewalls to the bottom surface,
         the bottom surface of the trench at a lower level than the top surface of the device isolation layer under the gate pattern, and
         the second sidewalls of the trench have inclined {111} planes.

2. The semiconductor device of claim 1, wherein the second sidewalls of the trench are located at a lower level than the top surface of the device isolation layer beneath the gate pattern.

3. The semiconductor device of claim 1, wherein lengths of the first sidewalls are greater than lengths of the second sidewalls.

4. The semiconductor device of claim 1, wherein upper ends of the first sidewalls of the trench are rounded.

5. The semiconductor device of claim 1, further comprising:
   a spacer on a side surface of the gate pattern, wherein the sidewalls of the trench vertically overlap the spacer.

6. The semiconductor device of claim 5, wherein the spacer includes:
   an inner spacer on the side surface of the gate pattern; and
   an outer spacer on a side surface of the inner spacer.

7. The semiconductor device of claim 6, wherein the outer spacer includes an insulating material having a relatively low dielectric constant.

8. The semiconductor device of claim 7, wherein the outer spacer includes silicon oxycarbonitride (SiOCN).

9. The semiconductor device of claim 1, wherein the epitaxial layers includes:
   a first epitaxial layer conformally formed on an inner wall of the trench; and
   a second epitaxial layer on the first epitaxial layer filling the trench.

10. The semiconductor device of claim 9, wherein the first epitaxial layer includes silicon germanium having a germanium content less than or equal to 30%, and the second epitaxial layer includes silicon germanium having a germanium content greater than or equal to 30%.

11. A semiconductor device comprising:
    a fin active region protruding from a substrate;
    a device isolation layer surrounding a lower portion of the fin active region, and having a first portion and a second portion;
    a gate pattern covering an upper portion of the fin active region, and extending above the first portion of the device isolation layer; and
    an epitaxial region in the fin active region at a side of the gate pattern,
    wherein a bottom surface of the epitaxial region is located at a lower level than a top surface of the first portion of the device isolation layer and located at the same level as a top surface of the second portion of the device isolation layer, side surfaces of the epitaxial region include first side surfaces and second side surfaces connecting the first side surfaces to the bottom surface, and the second side surfaces have inclined {111} planes.

12. The semiconductor device of claim 11, wherein lengths of the second side surfaces are less than lengths of the first side surfaces, and the epitaxial region is convex in the lateral direction.

13. The semiconductor device of claim 11, further comprising:
    an inner spacer on a side surface of the gate pattern; and
    an outer spacer on the inner spacer.

14. The semiconductor device of claim 11, wherein the gate pattern includes:
    a gate insulating pattern on the fin active region and having a U shape;
    a gate barrier pattern on the gate insulating pattern and having a U shape; and
    a gate electrode pattern disposed on the gate barrier pattern,
    wherein top surfaces of the gate insulating pattern, the gate barrier pattern, and the gate electrode pattern are coplanar.

15. The semiconductor device of claim 11, further comprising:
    a lower interlayer insulating layer covering the epitaxial region and the second portion of the device isolation layer and surrounding side surfaces of the gate pattern; and
    an upper interlayer insulating layer covering the lower interlayer insulating layer and the gate pattern.

16. A semiconductor device comprising:
    a substrate;
    fin active regions protruding from the substrate and extend parallel to each other in a first direction;

a device isolation layer between the fin active regions, and covering lower portions of the fin active regions;

gate patterns covering upper portions of the fin active regions, and extending parallel to each other in a second direction perpendicular to the first direction;

spacers on side surfaces of the gate patterns; and stressors on the lower portions of the fin active regions between the gate patterns, wherein the stressors include first side surfaces which are located at the upper portions of the fin active regions and second side surfaces which are located at the lower portions of the fin active regions, lengths of the second side surfaces are less than lengths of the first side surfaces, the second side surfaces have inclined {111} planes, and the first side surfaces and the second side surfaces vertically overlap the spacers.

17. The semiconductor device of claim 16, wherein the stressors include:

trenches;

first epitaxial layers conformally formed on inner walls of the trenches; and second epitaxial layers on the first epitaxial layers filling the trenches.

18. The semiconductor device of claim 17, wherein the second epitaxial layers are in direct contact with the fin active regions exposed to upper ends of the inner walls of the trenches.

19. The semiconductor device of claim 17, wherein the first epitaxial layers have bar-shaped longitudinal sections and the second epitaxial layers have diamond-shaped longitudinal sections.

20. The semiconductor device of claim 16, wherein the lower portions of the fin active regions include:

first portions under the gate patterns; and second portions under the stressors, wherein top surfaces of the second portions are located at a lower level than top surfaces of the first portions.

* * * * *